US 6,649,465 B2

(12) United States Patent
Iijima et al.

(10) Patent No.: US 6,649,465 B2
(45) Date of Patent: Nov. 18, 2003

(54) PROCESS FOR MANUFACTURING A SEMICONDUCTOR MEMORY DEVICE INCLUDING A MEMORY CELL SELECTING TRANSISTOR AND A CAPACITOR WITH METAL ELECTRODES

(75) Inventors: Shinpei Iijima, Akishima (JP); Satoshi Yamamoto, Ome (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/943,506

(22) Filed: Aug. 31, 2001

(65) Prior Publication Data
US 2002/0045310 A1 Apr. 18, 2002

(30) Foreign Application Priority Data
Oct. 18, 2000 (JP) ......................................... 2000-317343

(51) Int. Cl.[7] ......................................... H01L 21/8242
(52) U.S. Cl. ............................ 438/240; 438/3; 438/253
(58) Field of Search ........................ 438/3, 240, 253, 438/396, 397, 398, 254, 255, 656

(56) References Cited

U.S. PATENT DOCUMENTS

| 6,060,735 | A | * | 5/2000 | Izuha et al. .................. 257/295 |
| 6,306,667 | B1 | * | 10/2001 | Arita et al. .................. 438/240 |
| 6,399,399 | B2 | * | 6/2002 | Yamamoto .................. 438/240 |
| 2001/0031527 | A1 | * | 10/2001 | Park ........................... 438/239 |

* cited by examiner

Primary Examiner—Tuan H. Nguyen
(74) Attorney, Agent, or Firm—Antonelli, Terry, Stout & Kraus, LLP

(57) ABSTRACT

A technique is provided which is capable of forming a Ru film constituting a lower electrode of an information storing capacitive element in an aperture with high precision. After a Ru film is deposited, heat treatment is performed in a reducing atmosphere on a side wall and a bottom portion of a deep aperture in which the information storing capacitive element is formed. The deposition and heating of Ru films can be repeated to form a laminated structure of Ru films. As a result, it is possible to effectively remove impurities included in the Ru film, and to achieve fineness of the Ru film.

17 Claims, 46 Drawing Sheets

PROCESS FOR MANUFACTURING A SEMICONDUCTOR MEMORY DEVICE INCLUDING A MEMORY CELL SELECTING TRANSISTOR AND A CAPACITOR WITH METAL ELECTRODES

BACKGROUND OF THE INVENTION

The present invention relates to a semiconductor integrated circuit device and a process for manufacturing the same. More particularly, the invention relates to a technique that is effectively applicable to a structure for forming an information storing capacitive element having an MIM (Metal-Insulator-Metal) structure, in an aperture (a recess) formed in an insulating film, and also to a process for manufacturing the element.

A DRAM has a memory cell selecting MISFET and an information storing capacitive element connected in series to this MISFET. The information storing capacitive element is formed, for example, by depositing a silicon film constituting a lower electrode, and a tantalum oxide film constituting a capacitive insulating film, and a silicon film constituting an upper electrode in this order.

Further, the information storing capacitive element is formed in the aperture formed deeply in the insulating film in order to achieve fineness thereof and attain a desired capacitance.

SUMMARY OF THE INVENTION

However, the lower electrode made of silicon needs to be subjected to heat treatment (in oxidizing atmosphere, at 800° C., for 3 minutes) in order to improve crystallization and film quality of tantalum oxide formed on an upper layer thereof. During the heat treatment, a silicon nitride film is formed at an interface between the silicon film and the tantalum oxide film. Consequently, the tantalum oxide film and the silicon nitride film act as dielectric members. Although leakage current flowing therethrough can be reduced, a large dielectric constant thereof is difficult to be achieved.

The smaller the element becomes, the smaller the diameter of the aperture in which the information storage capacitive element is formed becomes further. As the diameter of the aperture decreases, silicon films crystallized on an inner uneven surface of the aperture are in contact with one another. Consequently, it is no longer possible to form an upper layer of the tantalum oxide or the like.

Inventors of the present invention have studied and developed materials for a lower electrode constituting an information storing capacitive element. To solve the above-mentioned problem, they have proposed that ruthenium (Ru) may be used as materials of the lower electrode.

This Ruthenium is thought to generate no film having a small dielectric constant such as an oxynitriding film, and to be capable of being formed thin because the ruthenium is metal.

However, the inventors have studied use of a Ru film as a lower electrode, and consequently found drawbacks of leakage current and electric contact failure and the like.

The inventors have hard studied these drawbacks, and consequently thought that the leakage current flows for the following reasons.

As will be described later in detail, a Ru film is formed by reacting a Ru organic compound with an oxidizer. Due to this, organic substances and oxygen are taken in the Ru film. As a result, the Ru film is poor in fineness and has unevenness on a surface thereof.

Over such the Ru film, a capacitive insulating film of a tantalum oxide film or the like may be formed, and heat treatment may then be performed to crystallize the tantalum oxide and improve a quality of the film thereof. By this, the Ru film shrinks and changes, and thereby causes the tantalum oxide film of an upper layer thereof to be deformed. As a result, the leakage current is thought to flow therethrough.

Further, regarding the electric contact failure, this is probably because the oxygen in the Ru film diffuses into a plug for connecting a memory cell selecting MISFET and the Ru film (a lower electrode of the information storing capacitive element), and thereby an oxide (an insulating substance) is formed over a surface of this plug.

An object of the present invention is to provide a technique of forming a Ru film constituting a lower electrode of an information storage capacitive element, in an aperture, with high precision.

Another object of the invention is to provide a technique of forming a Ru film with high quality, and thereby of improving a characteristic of a capacitive insulating film formed thereon and further improving a characteristic of the information storing capacitive element.

The above-mentioned and the other objects and the novel features of the present invention will be apparent from the description of the present specification and the accompanying drawings.

Of inventions disclosed in the present application, representative inventions will be described as follows.

1. According to the present invention, a process for manufacturing a semiconductor integrated circuit device comprises the steps of: (a) forming a memory cell selecting MISFET over a major surface of a semiconductor substrate; (b) forming a plug electrically connected to a source and drain region of said memory cell selecting MISFET; (c) forming a silicon oxide film on said plug; (d) forming an aperture arriving at a surface of said plug, in said silicon oxide film; (e) repeating deposition of a Ru film and performance of heat treatment and thereby forming a laminating film of a Ru film on a side wall and a bottom portion of said aperture; (f) forming a capacitive insulating film over said laminating film of a Ru film; and (g) forming an upper electrode on said capacitive insulating film.

2. Said performance of heat treatment includes heat treatment performed in reducing atmosphere.

3. And, according to the present invention, a process for manufacturing a semiconductor integrated circuit device comprises the steps of: (a) forming a memory cell selecting MISFET over a major surface of a semiconductor substrate; (b) forming a plug electrically connected to a source and drain region of said memory cell selecting MISFET; (c) forming a silicon oxide film on said plug; (d) forming an aperture arriving at a surface of said plug, in said silicon oxide film; (e) making an organic compound of Ru react with an oxidizer and thereby forming a Ru film on a side wall and a bottom portion of said aperture; (f) heat-treating said Ru film in reducing atmosphere; (g) forming a capacitive insulating film over said Ru film; and (h) forming an upper electrode over said capacitive insulating film.

4. And, according to the present invention, a process for manufacturing a semiconductor integrated circuit device comprises the steps of: (a) forming a memory cell selecting MISFET over a major surface of a semiconductor substrate; (b) forming a plug electrically connected to a source and drain region of said memory cell selecting MISFET; (c) forming a silicon oxide film on said plug; (d) forming an aperture arriving at a surface of said plug, in said silicon oxide film; (e) making an organic compound of Ru react with an oxidizer and thereby forming a Ru film on a side wall and a bottom portion of said aperture; (f) performing first heat treatment in reducing atmosphere and second heat treatment in non-oxidizing atmosphere at said Ru film; (g) forming a capacitive insulating film over said Ru film; and (h) forming an upper electrode over said capacitive insulating film.

5. A semiconductor integrated circuit device that is the present invention comprises: (a) a memory cell selecting MISFET formed over a major surface of a semiconductor substrate; (b) a plug electrically connected to a source and drain region of said memory cell selecting MISFET; (c) a silicon oxide film formed on said plug; (d) an aperture provided in said silicon oxide film and extending up to a surface of said plug, and having a depth five times longer than a short diameter thereof; and (e) an information storing capacitive element having a lower electrode formed in said aperture and composed of a laminating film of a Ru film formed by a CVD method, and a capacitive insulating film formed on said lower electrode, and an upper electrode formed over said capacitive insulating film.

DESCRIPTION OF THE PREFERRED EMBODIMENTS

Embodiments of the present invention will be described in detail, with reference to the accompanying drawings. Through all the drawings, the same reference number denotes members having the same function, and repetition thereof will be omitted.

(First Embodiment)

With reference to FIG. 1 to FIG. 18, a process for manufacturing a DRAM that is the present embodiment will be described in order of process thereof.

Figure 1:
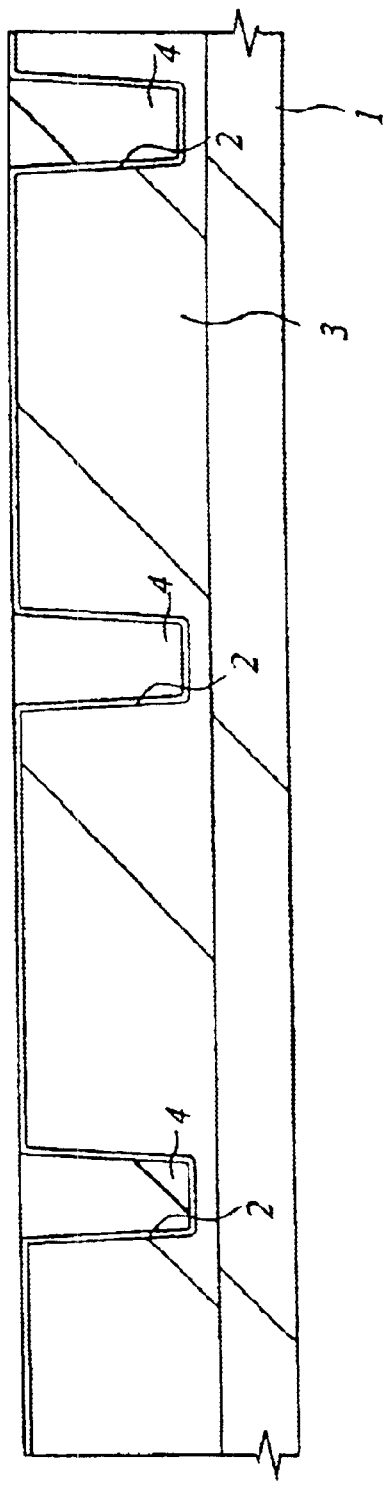
FIG. 1 is a cross-sectional view of a principal portion of a semiconductor substrate for illustrating a process for manufacturing a semiconductor integrated circuit device that is a first embodiment of the present invention.
Figure 2:
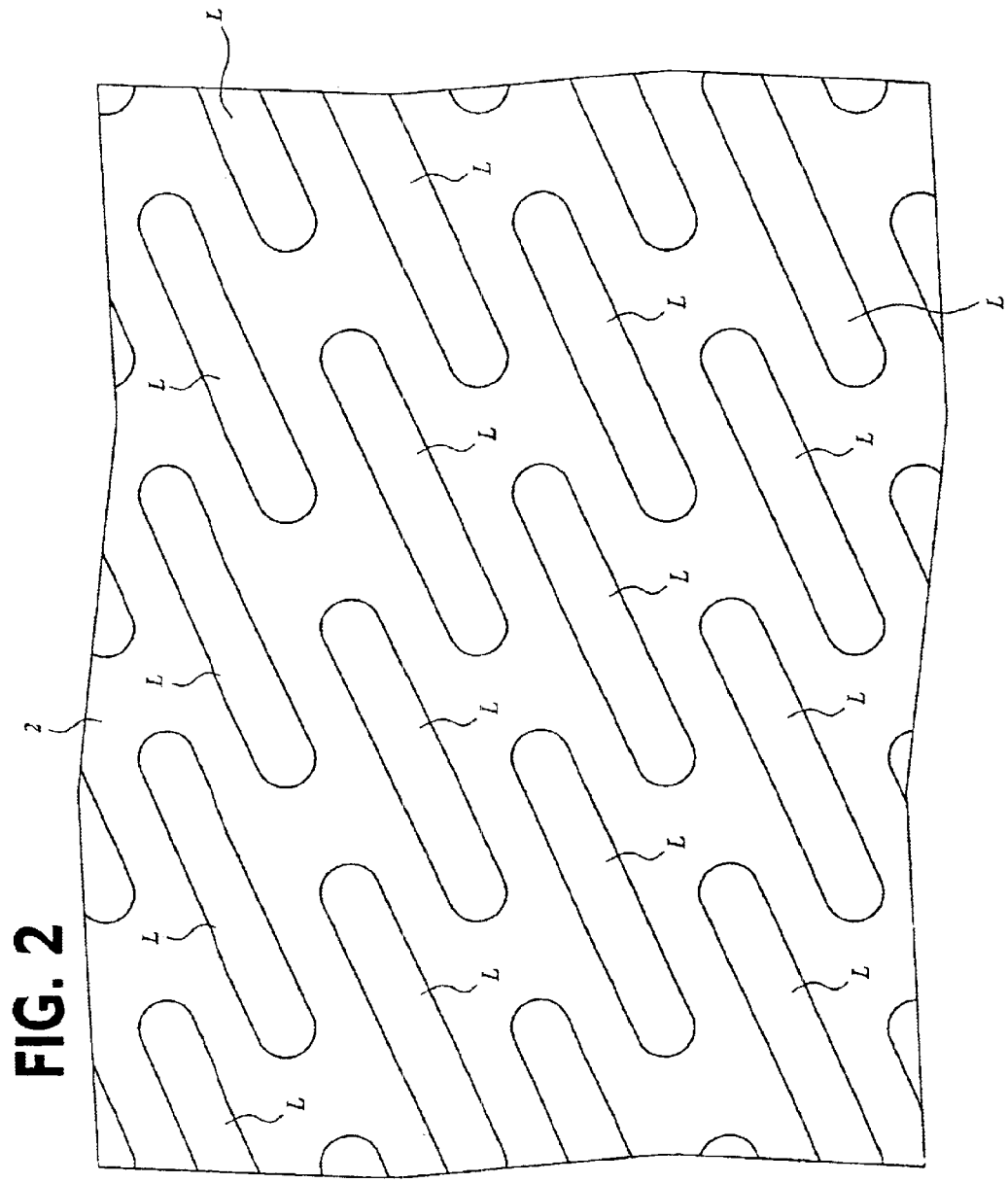
FIG. 2 is a plan view of a principal portion of a semiconductor substrate for illustrating a process for manufacturing a semiconductor integrated circuit device that is the first embodiment of the present invention.

First, as shown in FIG. 1, a semiconductor substrate (wafer) 1, for example, is made of p-type single crystal silicon, and an element isolation 2 is formed in an element isolating region of a major surface of the semiconductor substrate 1. As illustrated in FIG. 2, by forming the element isolation 2, thin island-shaped active regions (L) are simultaneously formed, each of whish is surrounded by the element isolation 2. Each of these active regions (L) has two memory cell selecting MISFET Qs, each of which has one of a source and a drain in common.

The element isolation 2 has been formed in the following method. First, a surface of the semiconductor substrate 1 is etched to form trenches having a depth of about 300 to 400 nm. Then, a thin silicon oxide film is formed in each trench. A silicon oxide film 4 (having a film thickness of about 600 nm) is deposited over the semiconductor substrate 1 and filled in these trenches by a CVD (Chemical Vapor Deposition) method. Thereafter, the silicon oxide film 4 is back-polished by a chemical mechanical polishing (CMP) method.

Next, B (boron) is ion-implanted into the semiconductor substrate 1 and thereby a p-type well 3 is formed. A surface of the p-type well 3 is cleaned with a HF(hydrofluoric acid)-based cleaning solution. Then, the semiconductor substrate 1 is subjected to thermal oxidation. A gate insulating film 5 having a film thickness of about 6 nm is thereby formed on the p-type well 3 (active region L).

Figure 3:
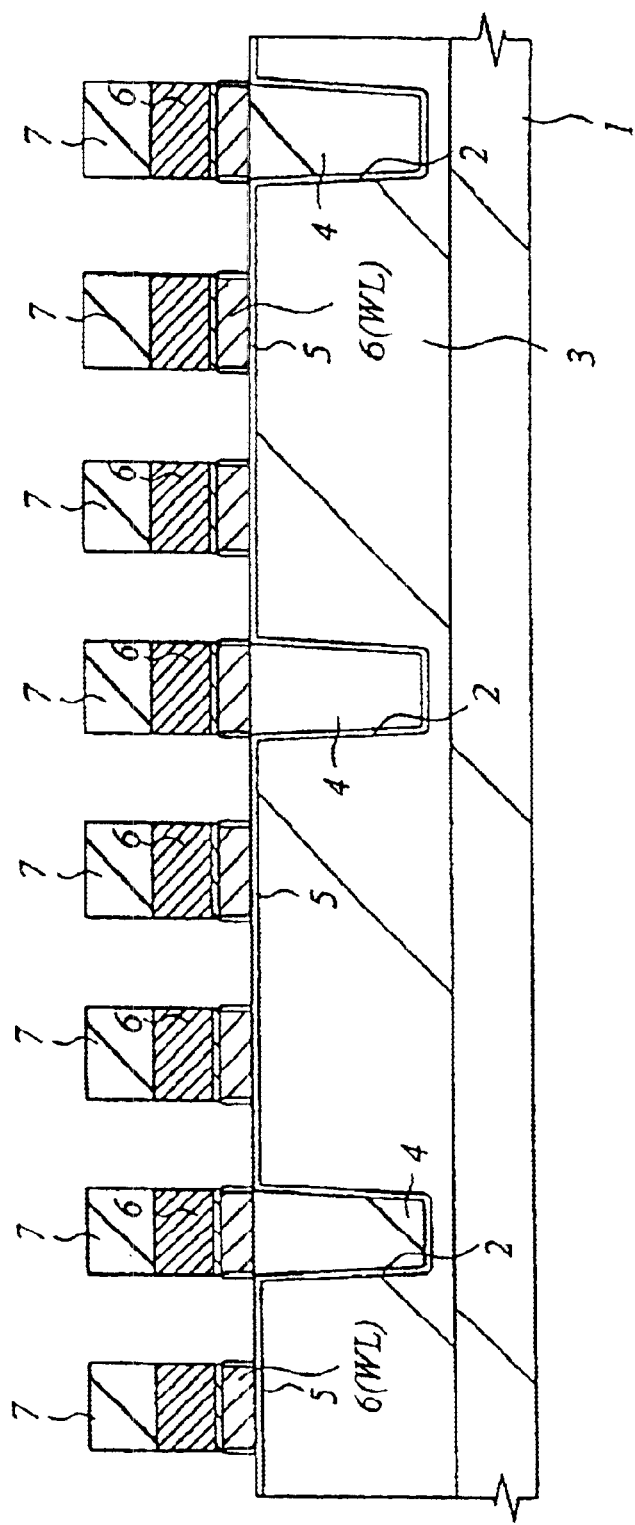
FIG. 3 is a cross-sectional view of a principal portion of a semiconductor substrate for illustrating a process for manufacturing a semiconductor integrated circuit device that is the first embodiment of the present invention.

As shown in FIG. 3, gate electrodes 6 are formed over the gate insulating film 5. More precisely, the gate electrodes 6, for example, are formed in two steps. In a first step, an n-type polycrystalline silicon film (having a film thickness of about 70 nm) doped with P (phosphorus) or the like, and a barrier metal film (having a film thickness of about 5 nm to 10 nm) made of WN (tungsten nitride) or TiN (titanium nitride), and a W film (having a film thickness of about 100 nm), and a silicon nitride film 7 (having a film thickness of about 150 nm) are deposited over the gate insulating film 5 in order mentioned. In a second step, after being deposited, these films are dry-etched by using a photoresist film as a mask. The polycrystalline silicon film and the silicon nitride film 7 are deposited by a CVD method, and the barrier metal film and the W film are deposited by a sputtering method. Each of the gate electrodes 6 has a function of a word line (WL). Thereafter, wet hydrogen oxidation is performed, and thereby a thin silicon oxide film is formed on a side wall of the n-type polycrystalline silicon film constituting the gate electrodes 6. The wet hydrogen oxidation can form an oxide film only on silicon.

Next, As (arsenic) or P (phosphorus) is ion-implanted into the p-type well 3, and thereby n-type semiconductor regions 8 (a source and a drain) are formed in the p-type well 3 located at both sides of each gate electrode 6. By processes as described above, memory sell selecting MISFET Qs are completed nearly.

Figure 4:
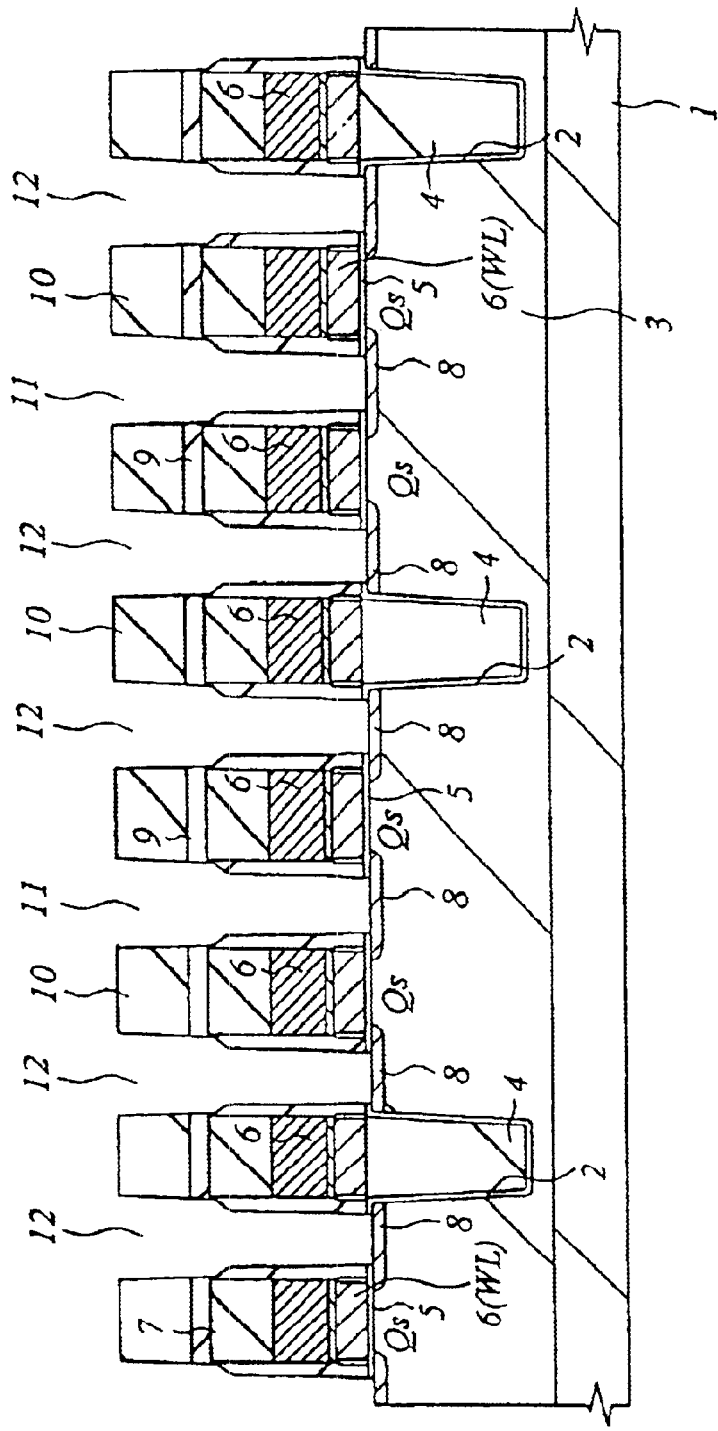
FIG. 4 is a cross-sectional view of a principal portion of a semiconductor substrate for illustrating a process for manufacturing a semiconductor integrated circuit device that is the first embodiment of the present invention.

As shown in FIG. 4, a silicon nitride film 9 (having a film thickness of about 50 nm) and a silicon oxide film 10 (having a film thickness of about 600 nm) are deposited over the semiconductor substrate 1 by a CVD method. Subsequently, a surface of the silicon oxide film 10 is made planarization by a chemical mechanical polishing method. Thereafter, the silicon oxide film 10 and the silicon nitride film 9 are dry-etched by using a photoresist film (not shown) as a mask. Contact holes 11 and 12 are thereby formed on the n-type semiconductor regions 8 (a source and a drain) of each of the memory cell selecting MISFET Qs. The silicon oxide film 10 is etched under the condition of a high selectivity to silicon nitride film, whereas the silicon nitride film 9 is etched under the condition of a high etch selectivity to silicon and a silicon oxide film. The contact holes 11 and 12 are therefore formed in self-alignment relative to the gate electrodes 6 (word lines).

Figure 5:
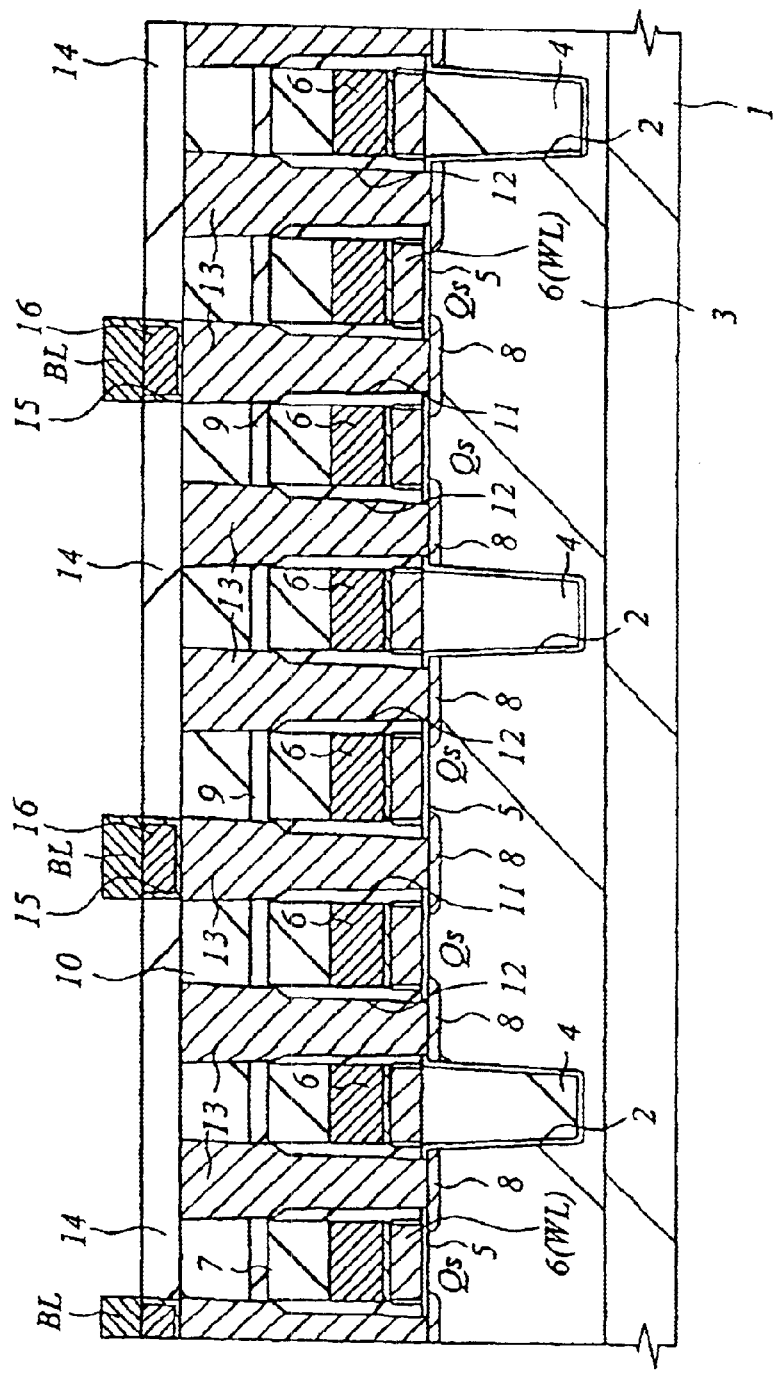
FIG. 5 is a cross-sectional view of a principal portion of a semiconductor substrate for illustrating a process for manufacturing a semiconductor integrated circuit device that is the first embodiment of the present invention.

Next, as shown in FIG. 5, plugs 13 are formed in the contact holes 11 and 12. In order to form the plugs 13, an n-type polycrystalline silicon film doped with P is deposited on the silicon oxide film 10 by a CVD method, and thereby the contact holes 11 and 12 are filled with this n-type polycrystalline silicon film. Then, the n-type polycrystalline silicon film located outside the contact holes 11 and 12 is removed by a chemical mechanical polishing method (or etch back).

Next, a silicon oxide film 14 (having a film thickness of about 150 nm) is deposited on the silicon oxide film 10 by a CVD method. The silicon oxide film 14 located on each of the contact holes 11 is dry-etching by using a photoresist film (not shown) as a mask, and thereby through holes 15 are formed.

Next, plugs 16 are formed in the through holes 15. In order to form the plugs 16, a barrier metal film formed of a laminating film of a Ti film and a TiN film is formed on the silicon oxide film 14 by, for example, a sputtering method. Then, a W film is deposited on the barrier metal film by a CVD method, and the through holes 15 are filled with these films. Thereafter, these films located outside each of the through holes 15 are removed by a chemical mechanical polishing method. Through these plugs 16 and 13, the n-type semiconductor regions 8 (source and drain) of the memory cell selecting MISFET Qs, and bit lines BL described later are connected respectively.

Next, the bit lines BL are formed on the silicon oxide film 14 and the plugs 16. In order to form the bit lines BL, not shown TiN film (having a film thickness of about 10 nm) is deposited on the silicon oxide film 14 by, for example, a sputtering method. Subsequently, a W film (having a film thickness of about 50 nm) is deposited on the TiN film by a CVD method. Thereafter, these films are dry-etched by using a photoresist film (not shown) as a mask.

Figure 6:
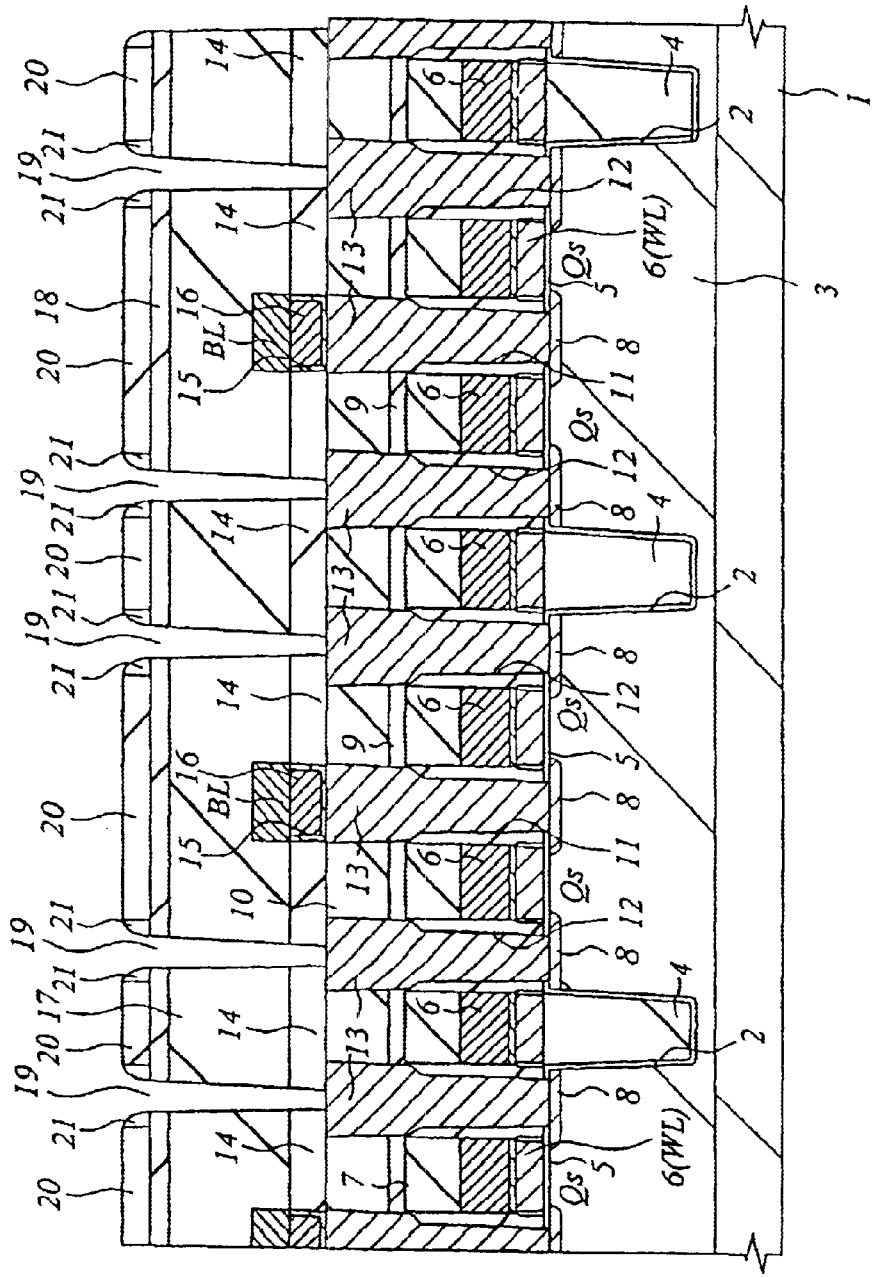
FIG. 6 is a cross-sectional view of a principal portion of a semiconductor substrate for illustrating a process for manufacturing a semiconductor integrated circuit device that is the first embodiment of the present invention.

Next, as shown in FIG. 6, a silicon oxide film 17 (having a film thickness of about 300 nm) is deposited on the bit lines BL by a CVD method, and subsequently planarization of a surface thereof is performed by a chemical mechanical polishing method. Next, a silicon nitride film 18 (having a film thickness of about 50 nm) is deposited on the silicon oxide film 17 by a CVD method. The silicon nitride film 18 and the silicon oxide film 17 are dry-etched, and thereby through holes 19 are formed on the contact holes 12 in which the plugs 13 are embedded.

Each diameter of the through holes 19 is formed so as to be smaller than each diameter of the contact holes 12 located below the through holes 19. To be more specific, a polycrystalline silicon film 20 is deposited on the silicon nitride film 18 by a CVD method. The polycrystalline silicon film 20 located on each of regions for forming the contact holes 19 is dry-etched to form holes. Thereafter, a polycrystalline silicon film (not shown) is further deposited on the polycrystalline silicon film 20. The polycrystalline silicon film located on the polycrystalline silicon film 20 is anisotropically etched, and thereby a side wall spacer 21 is formed on each hole. By using the polycrystalline silicon film 20 and each of the side wall spacers 21 as a hard mask, the silicon nitride film 18 and the silicon oxide film 17 located at a bottom surface of each hole are dry-etched.

Figure 7:
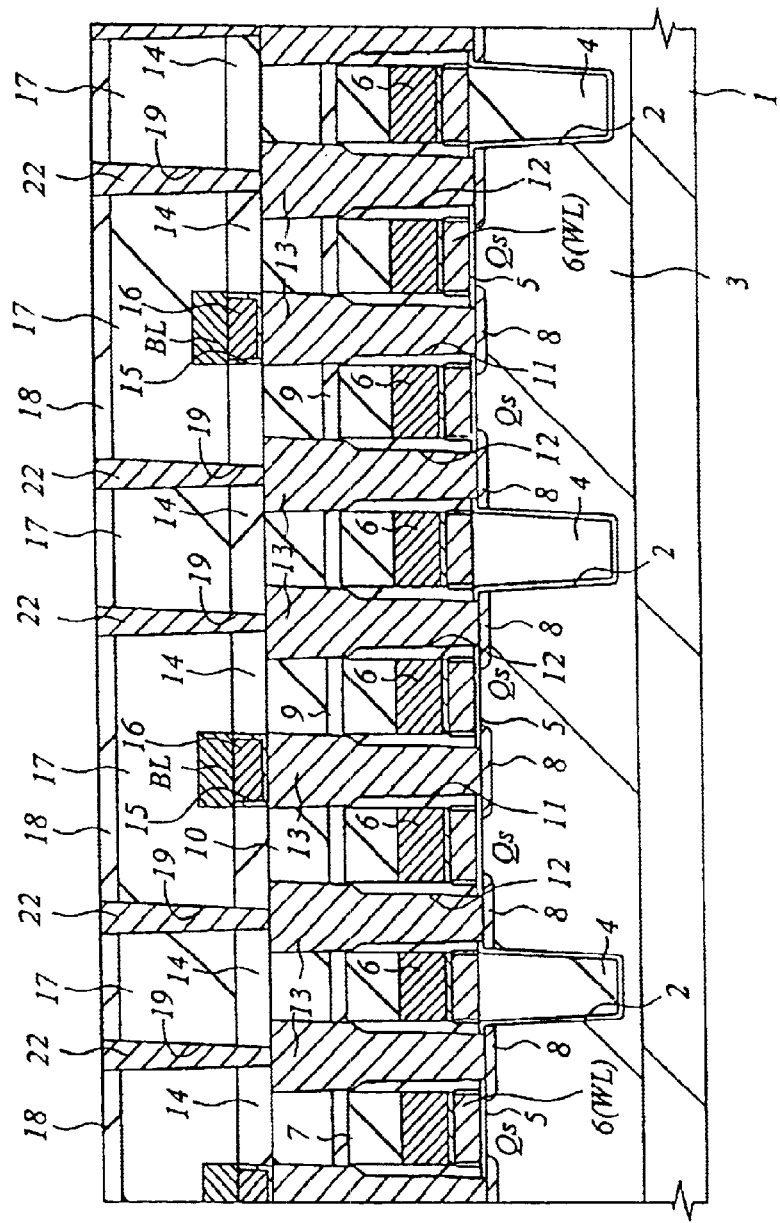
FIG. 7 is a cross-sectional view of a principal portion of a semiconductor substrate for illustrating a process for manufacturing a semiconductor integrated circuit device that is the first embodiment of the present invention.

Next, the polycrystalline silicon film 20 and each of the side wall spacers 21 are removed by dry etch. Plugs 22 are formed in the through holes 19, as illustrated in FIG. 7. In order to form the plugs 22, first, an n-type polycrystalline silicon film doped with P is deposited on the silicon nitride film 18 by a CVD method, and thereby the holes 19 is filled with the n-type polycrystalline silicon film. Then, the n-type polycrystalline silicon film located outside each through hole 19 is removed by a chemical mechanical polishing method (or by etch back).

Thereafter, an information storing capacitive element C constituted by a lower electrode 30A, a capacitor insulating film (capacitive insulating film), and an upper electrode 33 is formed over the plugs 22. The lower electrode 30A is formed of a Ru film, the capacitive insulating film is formed of a silicon oxide film 32, and the upper electrode 33 is formed of the W film/the Ru film.

The steps of forming this information storing capacitive element C will be described in detail with reference to FIGS. 8 to 18. These drawings are diagrams schematically showing a formation region for forming the information storing capacitive element C on the plugs 22.

Figure 8:
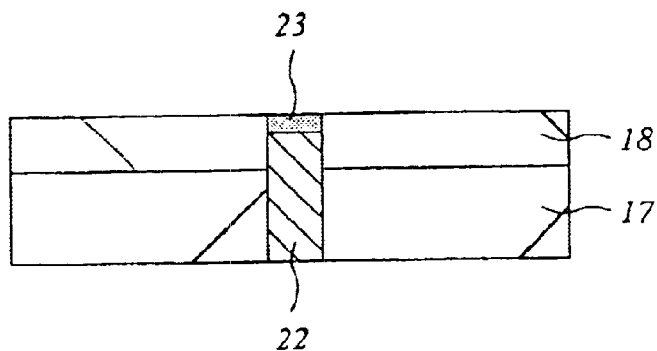
FIG. 8 is a cross-sectional view of a principal portion of a semiconductor substrate for illustrating a process for manufacturing a semiconductor integrated circuit device that is the first embodiment of the present invention.

As shown in FIG. 8, a barrier layer 23 is formed on a surface of each plug 22. In order to form the barrier layer 23, the surface of each plug 22 is first etched to go back the top surface of each plug 22 below a surface of the silicon nitride film 18. A space is thereby provided above each plug 22 to fill with the barrier layer 23. Next, a tantalum nitride film is deposited on the silicon nitride film 18 by a sputtering method. The space above each plug 22 is thereby filled with tantalum nitride film. Thereafter, the tantalum nitride film located outside the spaces is removed by a chemical mechanical polishing method (or by etch back). When each plug 22 is formed, that is, after the n-type polycrystalline silicon film is embedded in each through hole 19 by depositing the n-type polycrystalline silicon film doped with P, on the silicon nitride film 18, by a CVD method, the n-type polycrystalline silicon film located outside each through hole 19 is removed by a chemical mechanical polishing method (or by etch back). At this time, the n-type polycrystalline silicon film located inside each through hole 19 is over-polished (over-etched), and thereby the above-mentioned space may be provided. The barrier layer 23 may also be used as a TiN film. A metal silicide film may be formed at an interface between the barrier layer 23 and each plug 22. This metal silicide film can reduce contact resistance between the layer 23 and each plug 22. This metal silicide film may, for example, be formed in the following two steps. In a first step, a metal film such as a Ti film is formed in the above-mentioned space before deposition of tantalum nitride. In the second step, by heat treatment, a metal silicide film is formed on a surface of each plug 22. Thereafter, the metal film not reacted is removed, and thereby the barrier layer 23 made of tantalum nitride film is provided on the metal silicide.

Figure 9:
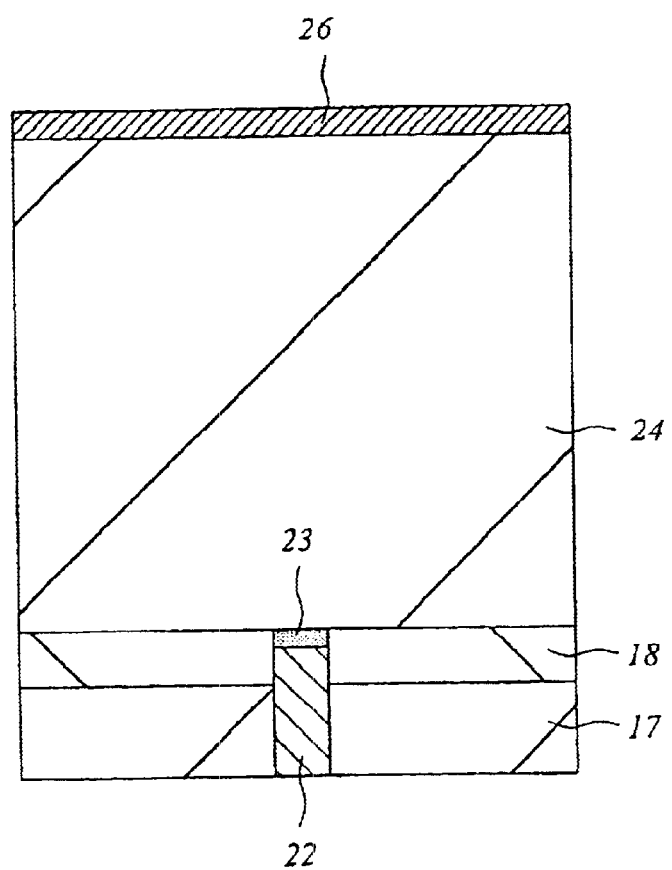
FIG. 9 is a cross-sectional view of a principal portion of a semiconductor substrate for illustrating a process for manufacturing a semiconductor integrated circuit device that is the first embodiment of the present invention.

Next, as shown in FIG. 9, a silicon oxide film 24 is deposited over the barrier layer 23 and the silicon nitride film 18. The lower electrode of the information storing capacitive element C is formed in an aperture (a recess) provided in the silicon oxide film 24. In order to enlarge surface area of the lower electrode and increase amounts of electric charge stored, it is necessary to deposit the silicon oxide film 24 thick (up to a film thickness of about 0.8 $\mu$m). The silicon oxide film 24 is deposited by a plasma CVD method using, for example, oxygen and tetraethoxysilane (TEOS) as source gas. Thereafter, if necessary, the surface thereof may be subjected to a chemical mechanical polishing method to attain a planarization.

Next, a hard mask 26 formed of a tungsten film is formed on the silicon oxide film 24. The hard mask 26 may be formed of metals other than tungsten.

Figure 10:
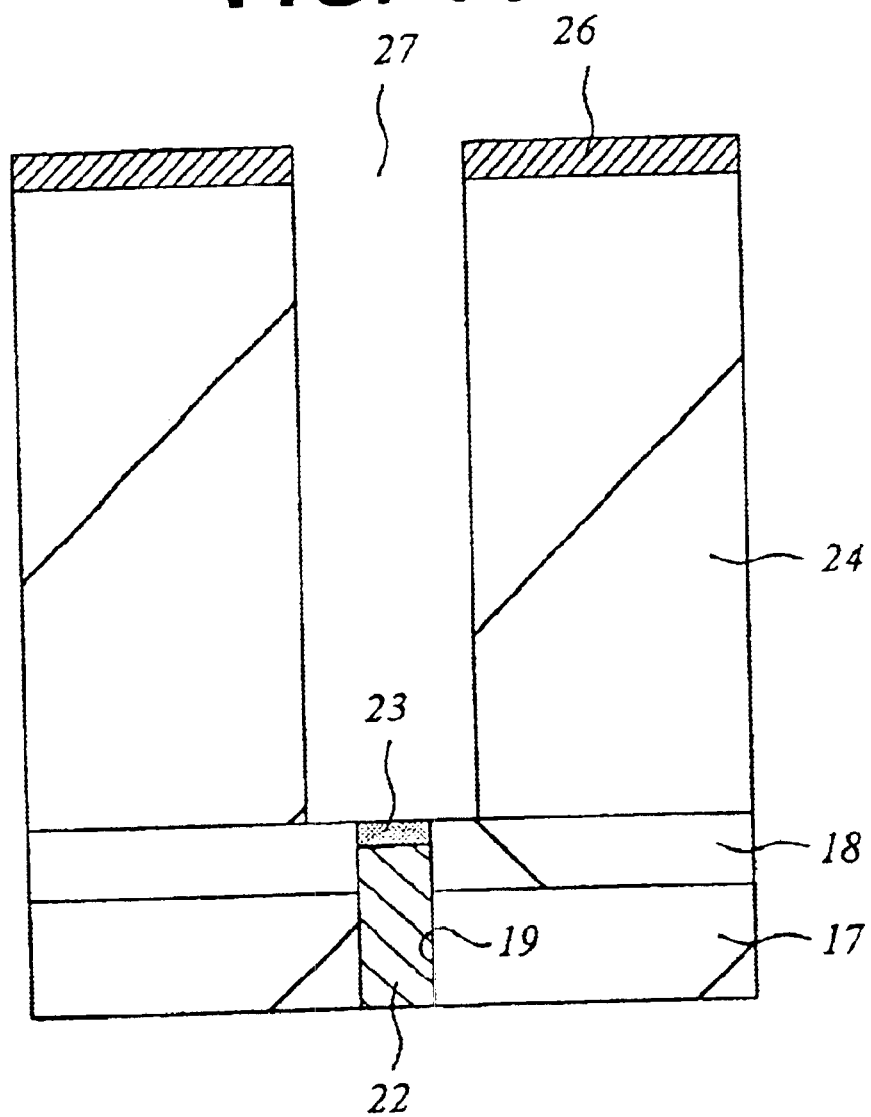
FIG. 10 is a cross-sectional view of a principal portion of a semiconductor substrate for illustrating a process for manufacturing a semiconductor integrated circuit device that is the first embodiment of the present invention.

Subsequently, as shown in FIG. 10, a photoresist film (not shown) is formed on the hard mask 26, and the hard mask 26 is dry-etched by using the photoresist film as a mask. Further, the silicon oxide film 24 and the silicon nitride film 18 are dry-etched by using the hard mask 26 as a mask, and thereby a deep aperture (recess) 27 is formed in the silicon oxide film 24. The barrier layer 23 provided in each through hole 19 is exposed at the bottom surface of the deep aperture 27.

Figure 11:
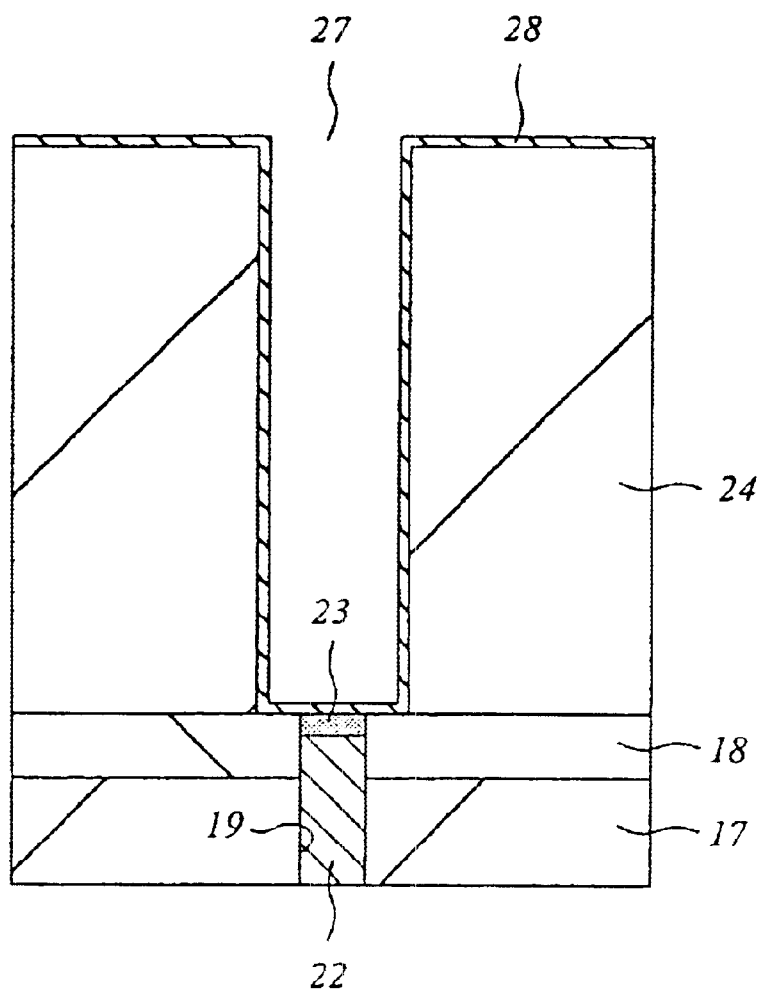
FIG. 11 is a cross-sectional view of a principal portion of a semiconductor substrate for illustrating a process for manufacturing a semiconductor integrated circuit device that is the first embodiment of the present invention.

Next, the hard mask 26 remaining on the silicon oxide film 24 is removed from the silicon oxide film 24 by using a solution containing hydrogen peroxide solution. As shown in FIG. 11, a tantalum oxide film 28 (having a film thickness of about 5 nm) is deposited on the silicon oxide film 24 and in the deep aperture 27 by a CVD method. This tantalum oxide film 28 can be formed within a range of a temperature of 400° C. to 450° C. by using Ta(OC$_2$H$_5$)$_5$ and O$_2$ as material gas. This tantalum oxide film 28 has a good characteristic of adhesion to both the silicon oxide film 24 being a base and a Ru film 30 described later, and is therefore used as an adhesive layer.

Figure 12:
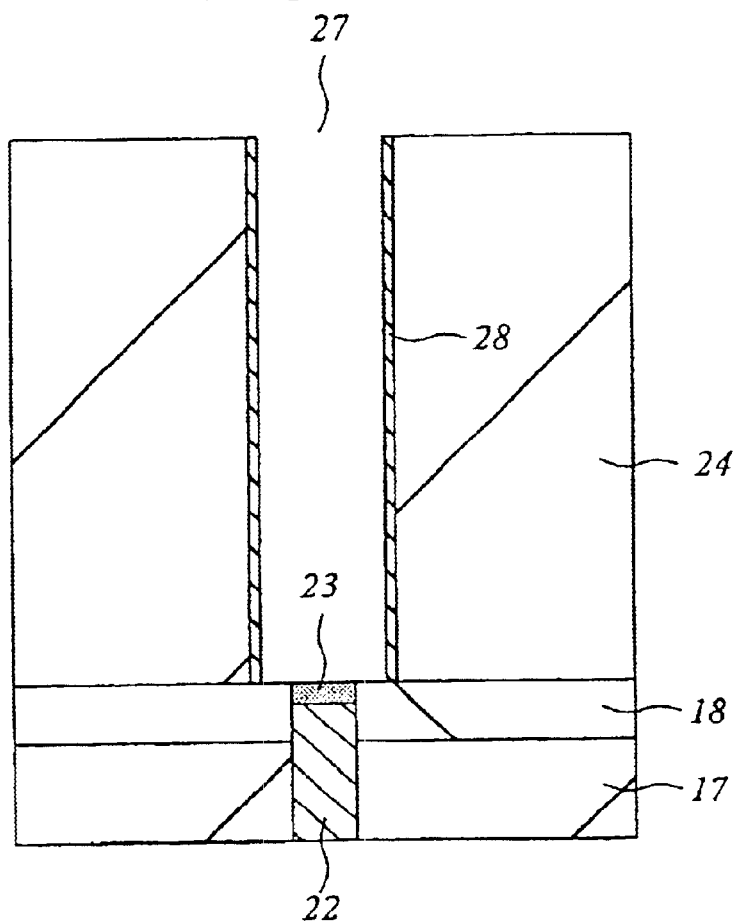
FIG. 12 is a cross-sectional view of a principal portion of a semiconductor substrate for illustrating a process for manufacturing a semiconductor integrated circuit device that is the first embodiment of the present invention.
Figure 13:
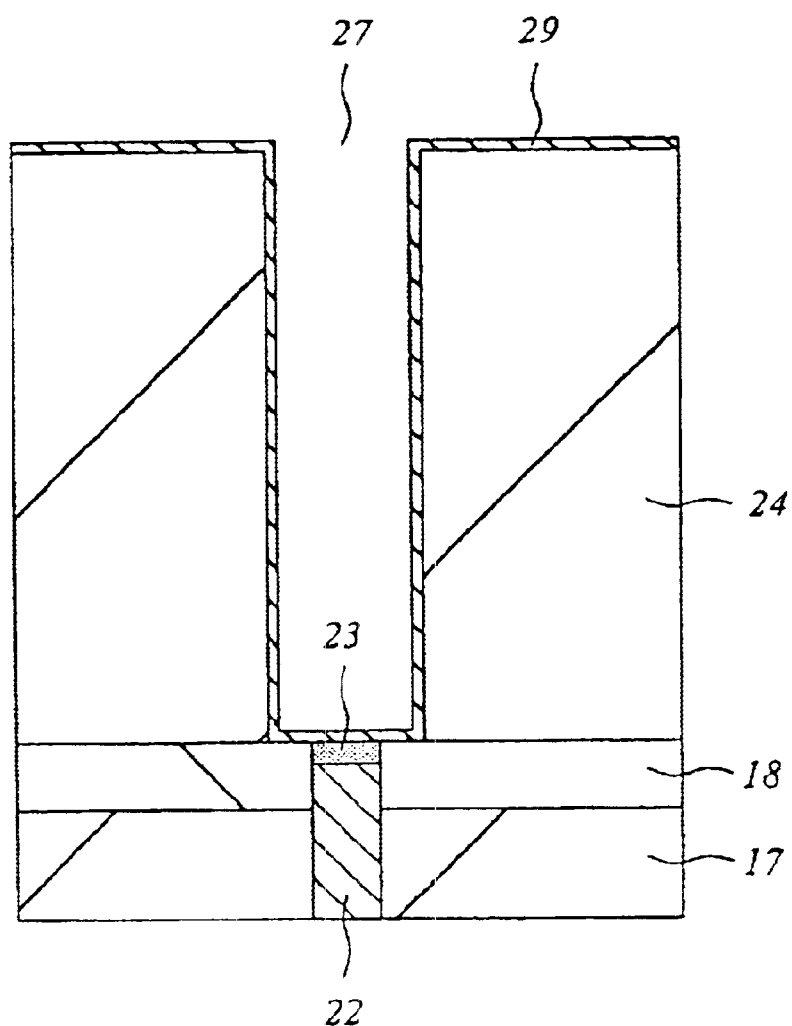
FIG. 13 is a cross-sectional view of a principal portion of a semiconductor substrate for illustrating a process for manufacturing a semiconductor integrated circuit device that is the first embodiment of the present invention.

Subsequently, as shown in FIG. 12, anisotropic etching is performed on the tantalum oxide film 28, and thereby the tantalum oxide film 28 existing on the silicon oxide film 24 and at a bottom portion of the aperture 27 is removed. And, the tantalum oxide film 28 is made to remain only on a side wall of the aperture 27. The tantalum nitride film may also be used as an adhesive layer. In the case where this tantalum film 29 is used as an adhesive layer, it is unnecessary to remove the tantalum nitride film existing on the bottom portion of the aperture 27 because the tantalum oxide film has an electric conduction. FIG. 13 shows the case of deposition of a tantalum nitride film 29 (having a film thickness of about 5 nm) on the silicon oxide film 24 and in the aperture 27. This tantalum nitride film 29 is formed by depositing a tantalum oxide film 28 (having a film thickness of about 5 nm) by a CVD method, and performing heat treatment at a temperature of 700° C. for 3 minutes in NH$_3$ atmosphere, and converting the tantalum oxide film to the tantalum nitride film. Remaining steps of forming the information storing capacitive element C will be described about the case where the tantalum nitride film 29 is used as an adhesive layer. But, the same steps will be performed even in the case the tantalum oxide film 28 is used as an adhesive layer.

Figure 14:
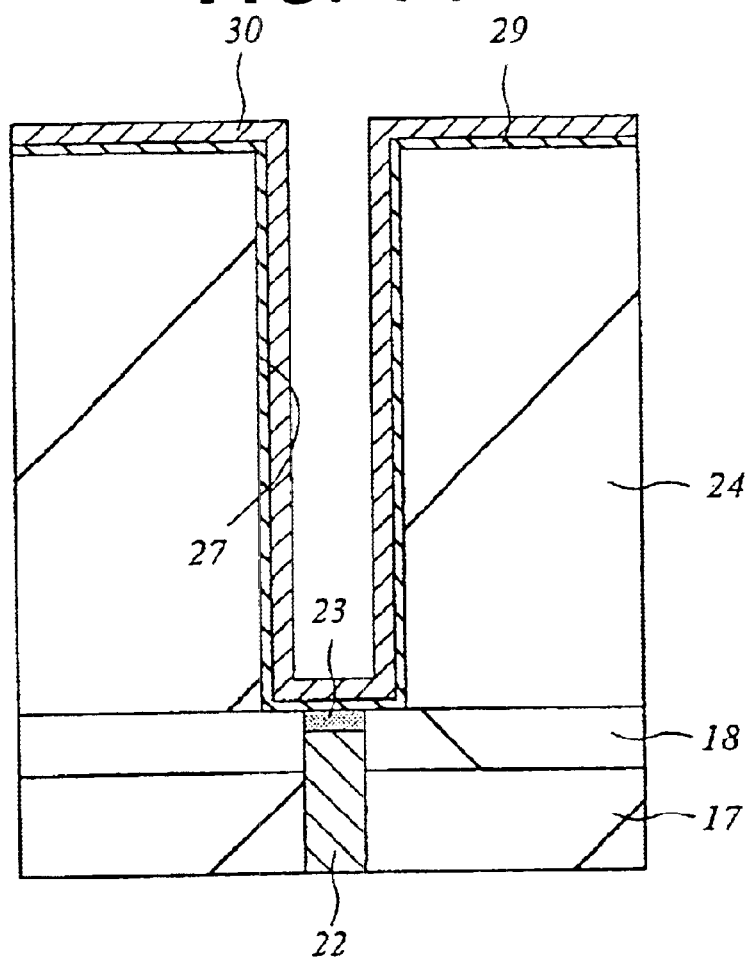
FIG. 14 is a cross-sectional view of a principal portion of a semiconductor substrate for illustrating a process for manufacturing a semiconductor integrated circuit device that is the first embodiment of the present invention.

As shown in FIG. 14, a Ru film 30 (having a film thickness of about 30 nm) is deposited on the tantalum nitride film 29 by a CVD method. A thin Ru film may be formed by a sputtering method before deposition of the Ru film 30 performed by a CVD method. If so, the thin Ru film formed by a sputtering method serves as a seed, and it is thereby possible to form the Ru film 30 with high efficiency. This Ru film 30 is efficiently formed by evaporating a Ru organic compound solution such as a tetrahydrofuran solution or the like containing ethylcyclopentadienyl ruthenium (Ru(C$_2$H$_5$C$_5$H$_4$)$_2$) and by being made to react with O$_2$.

Subsequently, heat treatment is performed at 600° C. for 3 minutes in reducing atmosphere such as NH$_3$ atmosphere or the like. Next, heat treatment is further performed at 750° C. for 2 minutes in non-oxidizing atmosphere such as N$_2$ atmosphere or the like.

Since heat treatment is thus performed in the reducing atmosphere in the present embodiment, oxygen and organic impurities taken in during formation of the Ru film 30 can be removed when the Ru film is formed. Additionally, it is possible to attain fineness of the Ru film 30 because the heat treatment is further performed at a high temperature in non-oxidizing atmosphere after being performed in reducing atmosphere.

Figure 15:
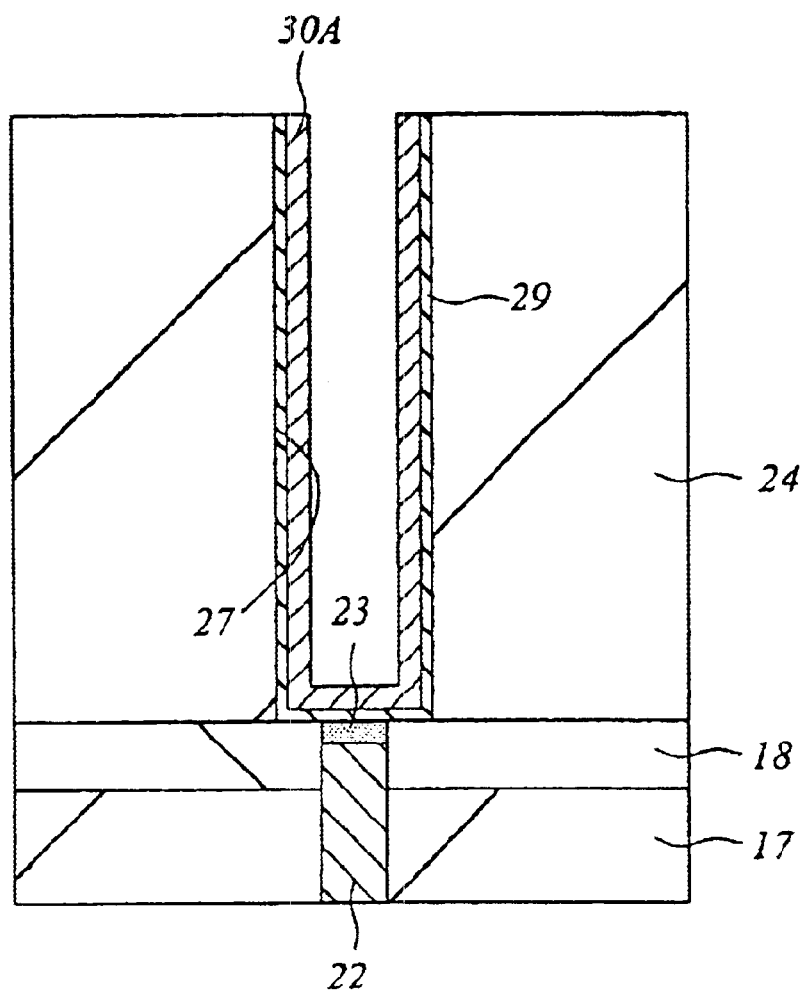
FIG. 15 is a cross-sectional view of a principal portion of a semiconductor substrate for illustrating a process for manufacturing a semiconductor integrated circuit device that is the first embodiment of the present invention.

Thereafter, the Ru film 30 is coated with a photoresist film (not shown). The photoresist film is exposed on all surfaces thereof and then is developed. Thereby, the photoresist film (not shown) is made to remain in the aperture 27. When the unused Ru film 30 located over the silicon oxide film 24 is removed by dry etch, this photoresist film is used as a protective film which prevents the photoresist film remaining in the aperture 27 (on the side wall and the bottom surface thereof) from being removed. Then, by performing dry etch using the photoresist film as a mask and by removing the Ru film 30 and the tantalum film 29 located on the silicon oxide film 24, the lower electrode 30A is formed. Then, the photoresist film is removed from the aperture 27 (as shown in FIG. 15).

Figure 16:
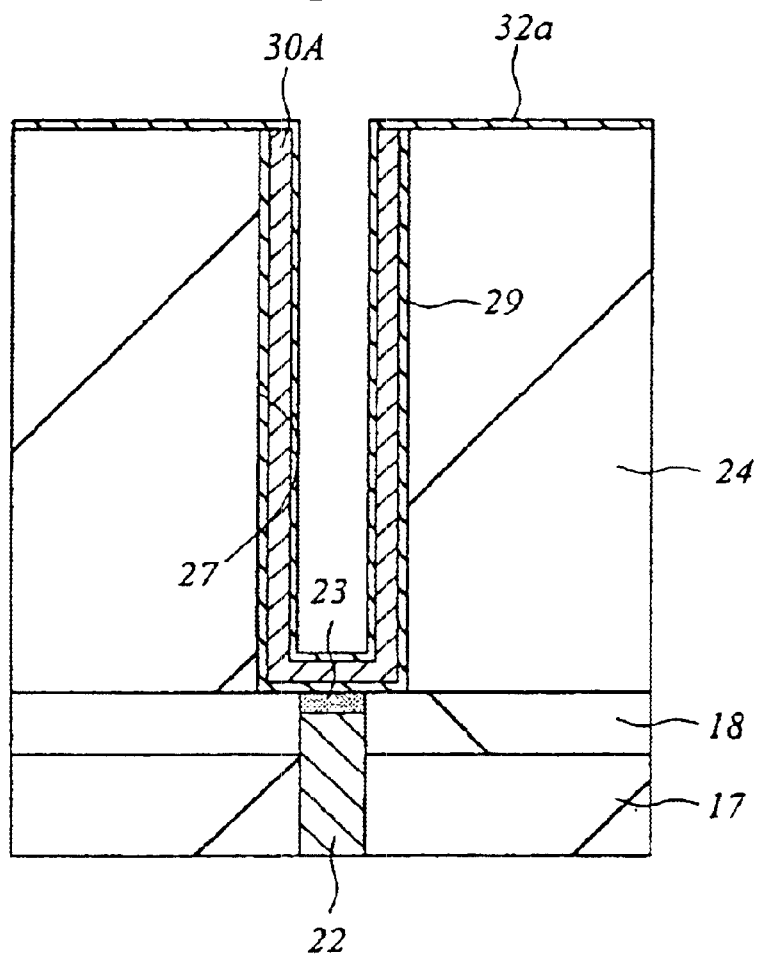
FIG. 16 is a cross-sectional view of a principal portion of a semiconductor substrate for illustrating a process for manufacturing a semiconductor integrated circuit device that is the first embodiment of the present invention.

Next, as shown in FIG. 16, a tantalum oxide film 32a constituting a capacitive insulating film is deposited on the silicon oxide film 24 and in the aperture 27 in which the lower electrode 30A is formed. The tantalum oxide film 32a is deposited by a CVD method using pentaethoxy tantalum (Ta(OC$_2$H$_5$)$_5$) and oxygen as materials, and a temperature of forming the film thereof is 420° C. The tantalum oxide film 32a has a film thickness of about 5 nm. Thereafter, heat treatment is performed at 700° C. for 2 minutes in non-oxidizing atmosphere, and thereby the tantalum oxide film 32a is crystallized.

Figure 17:
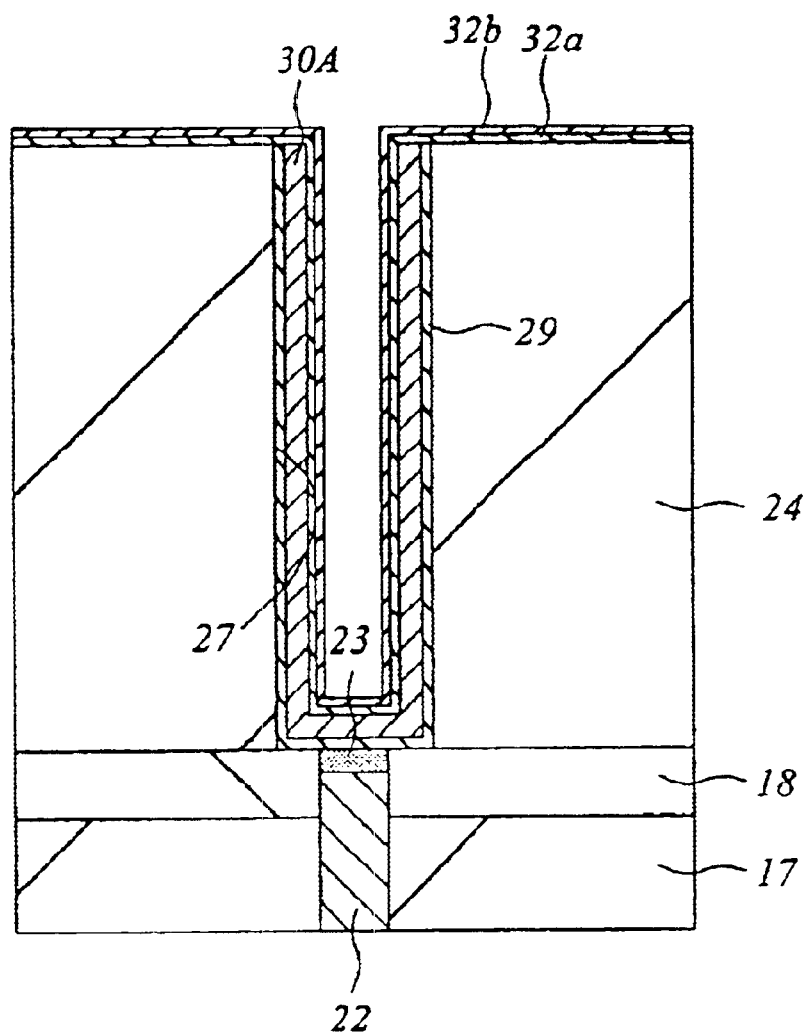
FIG. 17 is a cross-sectional view of a principal portion of a semiconductor substrate for illustrating a process for manufacturing a semiconductor integrated circuit device that is the first embodiment of the present invention.

As shown in FIG. 17, a tantalum oxide film 32b is further deposited on the tantalum oxide film 32a. This tantalum oxide film 32b is also deposited under the same condition as the tantalum oxide film 32a and has a film thickness of about 10 nm. In this case, the tantalum oxide film 32a being a base of the tantalum oxide film 32b has already been crystallized. Hence, the tantalum oxide film 32b is crystallized at the time of film formation by a CVD method, so that it is possible to omit heat treatment for crystallization.

Next, both tantalum oxide films 32a and 32b are heat-treated at about 550° C. for one minute in oxidizing atmosphere. Thereby, this can decrease leakage current flowing through the tantalum oxide film.

Figure 18:
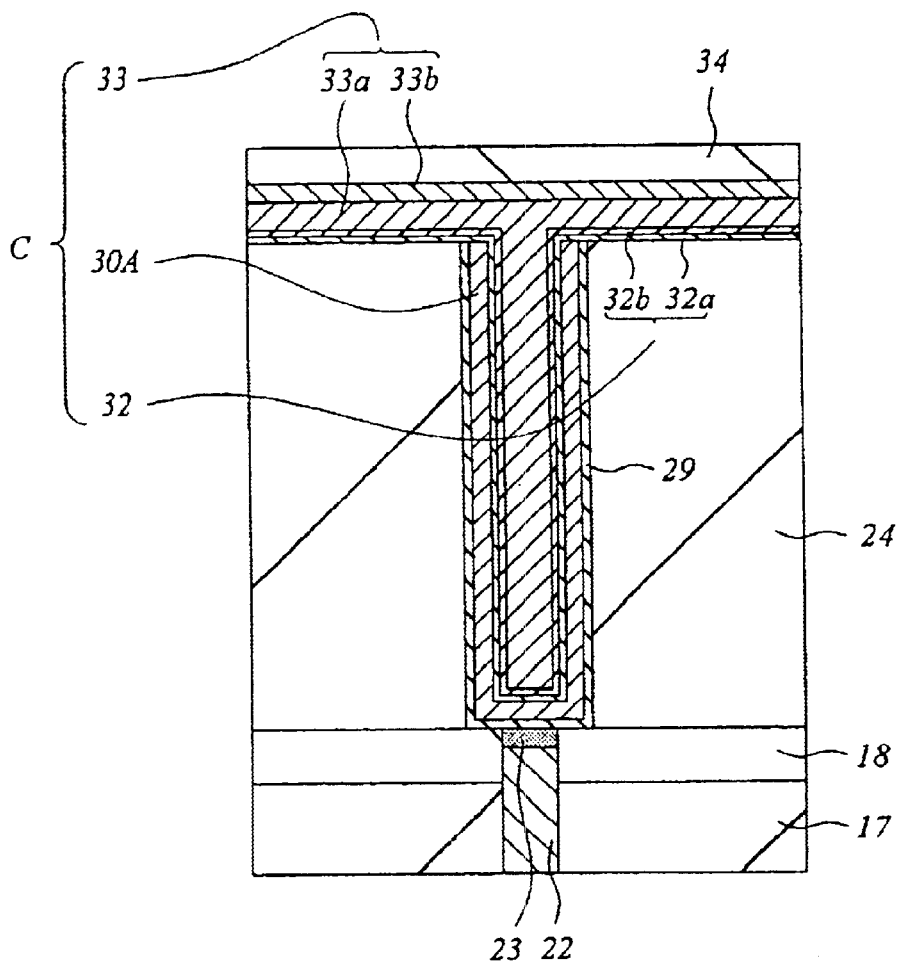
FIG. 18 is a cross-sectional view of a principal portion of a semiconductor substrate for illustrating a process for manufacturing a semiconductor integrated circuit device that is the first embodiment of the present invention.

As shown in FIG. 18, an upper electrode 33 is formed on the tantalum oxide film 32b. The upper electrode 33 is formed, for example, by depositing a Ru film 33a (having a film thickness of about 70 nm) and a W film 33b (having a film thickness of about 100 nm) on the tantalum oxide film 32b by a CVD method. The W film 33b is provided for the purpose of decreasing contact resistance between the upper electrode 33 and an upper-layer wiring. A TiN film may be formed between the Ru film 33a and the W film 33b to prevent resistance increase caused by diffusion of gas (oxygen or hydrogen) into the W film from the capacitive insulating film (tantalum oxide film 32).

Figure 47:
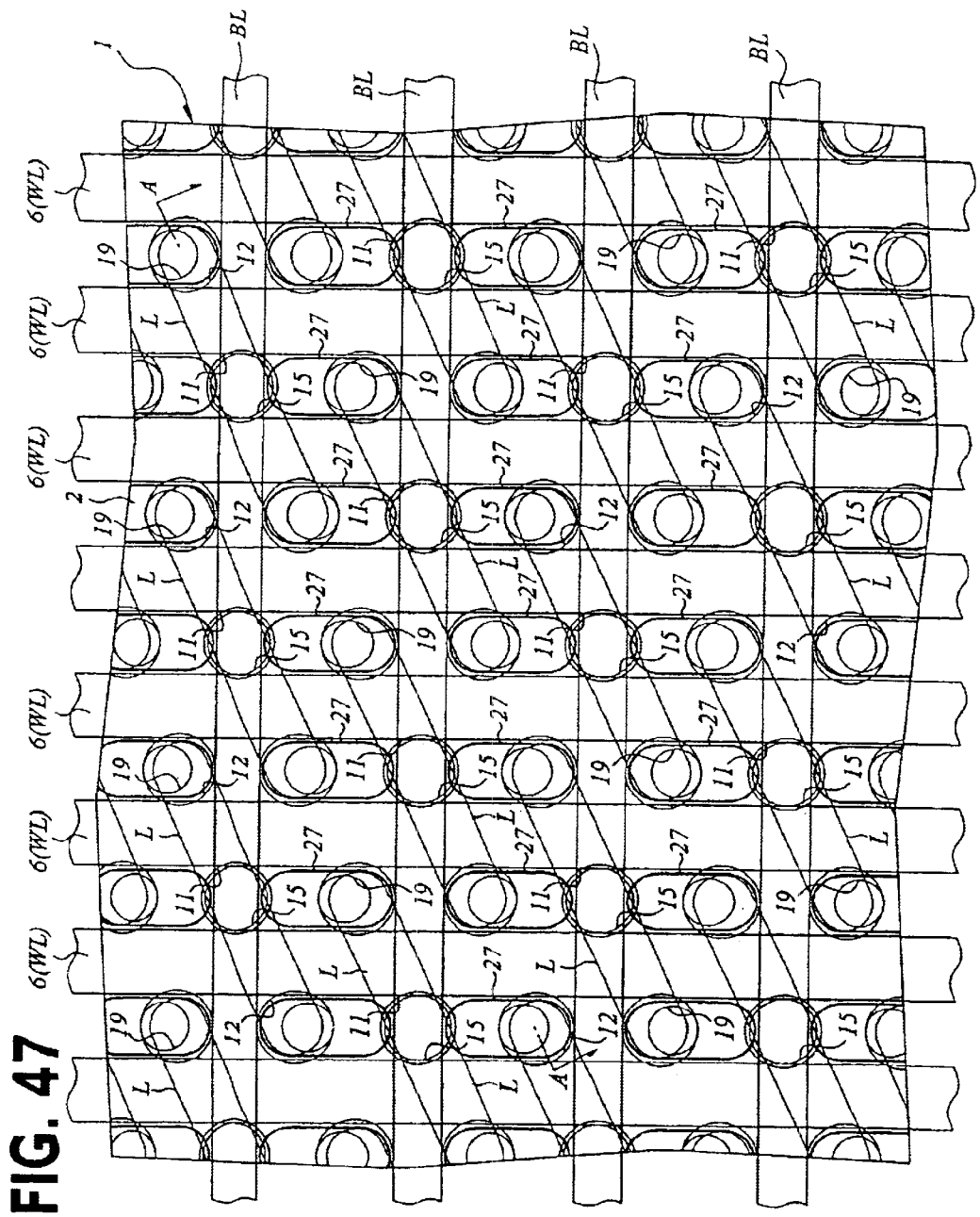
FIG. 47 is a plan view of a principal portion of a semiconductor substrate for illustrating a process for manufacturing a semiconductor integrated circuit device that is the present invention.

From processes described above, the information storing capacitive element C is completed, which comprises the lower electrode 30A formed of the Ru film 30, and the capacitive insulating film formed of the tantalum oxide 32 (32a and 32b), and the upper electrode 32 formed of the W film 33b/the Ru film 33a. And, a memory cell of a DRAM is nearly completed, which is constituted by the memory cell selecting MISFET Qs and the information storing capacitive element C connected in series thereto. FIG. 47 is a plan view of a semiconductor integrated circuit device after an information storing capacitive element C is formed. FIG. 7 is, for example, a cross-sectional view taken along line A—A shown in FIG. 47.

Thereafter, an inter-layer insulating film 34 formed of silicon oxide film or the like is formed on the information storing capacitive element C. Additionally, about two layers of Al wiring are formed on the inter-layer insulating film 34, and a passivation film is formed on an uppermost layer of Al wiring, but a drawing illustrating this structure will be omitted.

As described above in detail, according to the present embodiment, heat treatment is performed in reducing atmosphere. Therefore, it is possible to remove oxygen and organic impurities taken in the Ru film during formation of the Ru film constituting the lower electrode 30A. In addition, the Ru film 30 can attain fineness because heat treatment is further performed at a high temperature in non-oxidizing atmosphere after being performed in reducing atmosphere.

As a result, it is possible to prevent the barrier layer 23 being in contact with the Ru film 30 from being oxidized by affection of oxygen included in the Ru film 30. Electrical contact can be therefore achieved between the Ru film 30 and the barrier layer 23 (each plug 22).

Since oxygen and organic impurities taken in the Ru film 30 are removed during formation of the Ru film, the Ru film 30 can have a smoother surface than otherwise. Thus, when the heat treatment is performed again at a high-temperature in non-oxidizing atmosphere, planarization and fineness of the Ru film can be attained.

Thus, since the Ru film is made fine, shrinkage and change of the tantalum oxide film can be prevented at the time of heat treatment for formation of the tantalum oxide film formed thereon, and deformation of the tantalum oxide film can be reduced. As a result, this results in decrease in leakage current.

(Second Embodiment)

A process for manufacturing a DRAM, which is the present embodiment, will be described in process order with reference to FIGS. 19 to 26, below.

Figure 19:
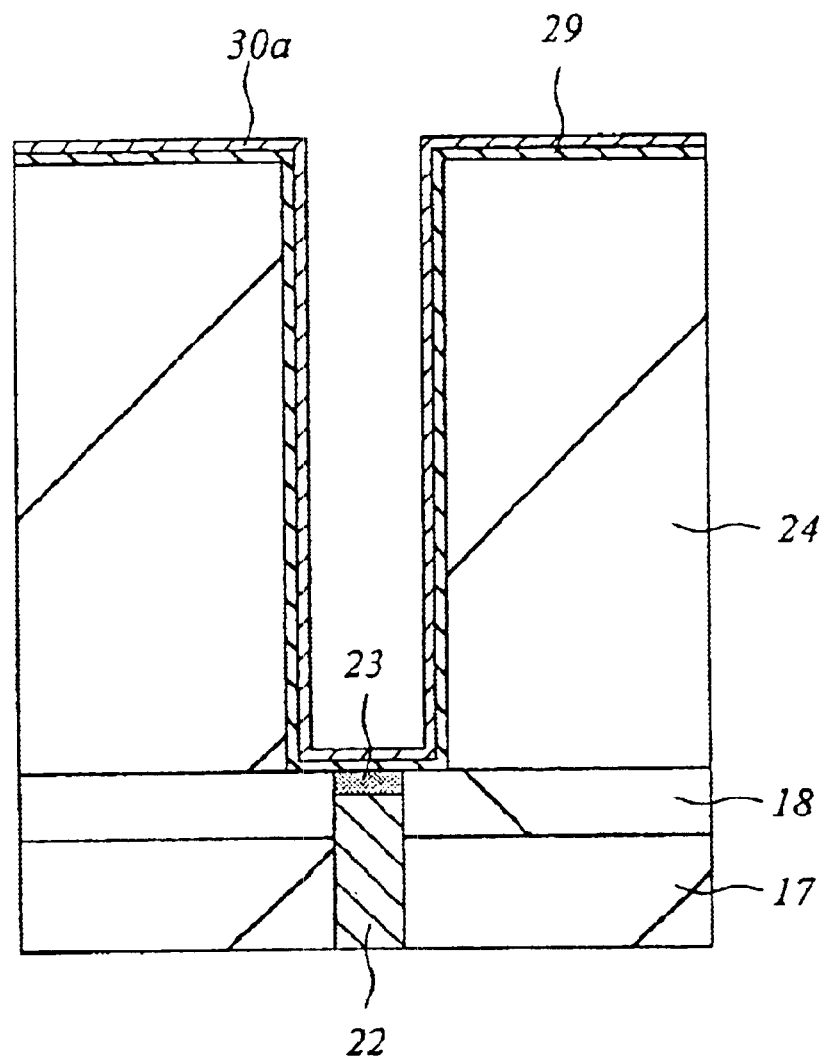
FIG. 19 is a cross-sectional view of a principal portion of a semiconductor substrate for illustrating a process for manufacturing a semiconductor integrated circuit device that is a second embodiment of the present invention.

FIG. 19 is a cross-sectional view of a principal portion of a semiconductor substrate for showing a process of manufacturing the semiconductor integrated circuit device that is a second embodiment of the present invention. In the case of the second embodiment, steps of forming the tantalum nitride film 29 (adhesive layer) shown in the drawings are the same as the case of the first embodiment described with reference to FIGS. 1 to 14. Therefore, an explanation of the above-mentioned steps will be omitted.

As shown in FIG. 19, a Ru film 30a (having a film thickness of about 10 nm) is deposited over the tantalum nitride film 29 by a CVD method. A thin Ru film may be formed by a sputtering method before deposition of the Ru film by this sputtering method. If so, the film formed by the sputtering method serves as a seed. Therefore, it is possible to form the Ru film with high efficiency by a sputtering method. The Ru film 30a is formed by evaporating a solution of a Ru organic compound such as a tetrahydrofuran solution or the like containing ethylcyclopentadienyl ruthenium (Ru $(C_2H_5C_5H_4)_2$) and by being made to react with $O_2$. Subsequently, heat treatment is performed at 600° C. for 3 minutes in reducing atmosphere such as $NH_3$ atmosphere or the like.

Figure 20:
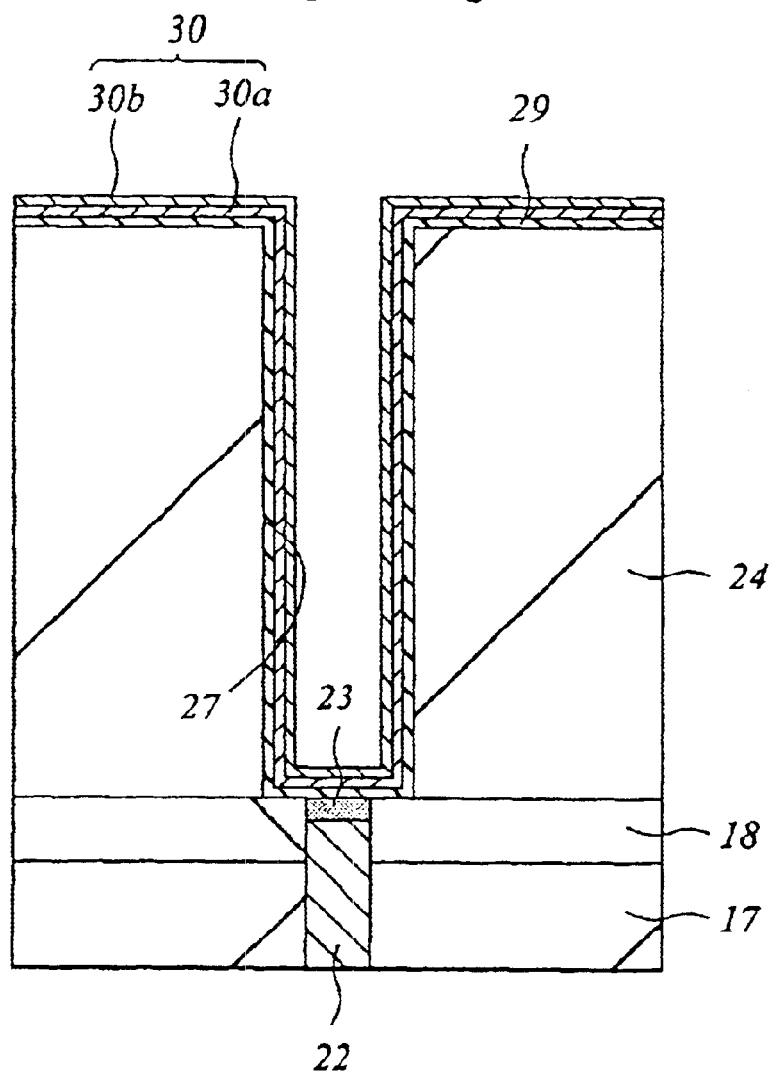
FIG. 20 is a cross-sectional view of a principal portion of a semiconductor substrate for illustrating a process for manufacturing a semiconductor integrated circuit device that is the second embodiment of the present invention.

As shown in FIG. 20, a Ru film 30b (having a film thickness of about 20 nm) is deposited on the Ru film 30a under the same conditions as the film 30a has been deposited. Heat treatment is performed at 750° C. for 2 minutes in non-oxidizing atmosphere. Prior to this heat treatment, other heat treatment may be performed at 600° C. for 3 minutes in reducing atmosphere such as $NH_3$ atmosphere or the like.

Thus, in the present embodiment, a Ru film has a laminating structure (i.e., the Ru film 30) of the Ru film 30a and the Ru film 30b. Since heat treatment is performed after both Ru films 30a and 30b are formed respectively, impurities can be efficiently removed from the Ru film. As a result, it is possible to achieve fineness of the Ru film 30.

Figure 21:
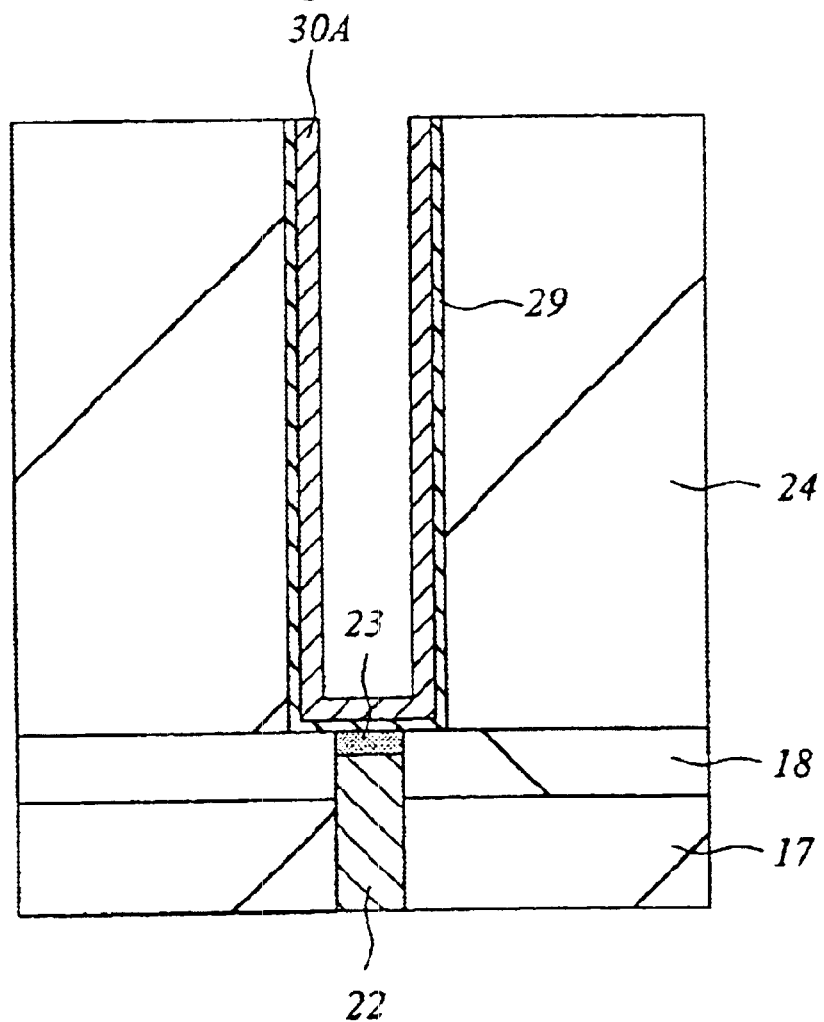
FIG. 21 is a cross-sectional view of a principal portion of a semiconductor substrate for illustrating a process for manufacturing a semiconductor integrated circuit device that is the second embodiment of the present invention.

Subsequently, the Ru film 30b is coated with a photoresist film (not shown). After all surfaces of the photoresist film are exposed, the photoresist film (not shown) is made to remain in the aperture 27 by development thereof. When the Ru films 30a and 30b and the tantalum nitride film 29 that are unnecessary on the silicon oxide film 24 in next step are removed by dry etch, this photoresist film is used as a protective film preventing the Ru film 30 (30a and 30b) located in the aperture 27 (a side wall and a bottom surface) from being removed. As shown in FIG. 21, by performing dry etch using the photoresist film as a mask and by removing the Ru films 30a and 30b located over the silicon oxide film 24, the lower electrode 30A is thereby formed. Then, the photoresist film located in the aperture 27 is removed.

Thereafter, the information storing capacitive element C is completed in the same manner as the case of the first embodiment (see FIGS. 16 to 18).

Alternatively, the information storing capacitive element C may be formed in the following step.

Figure 22:
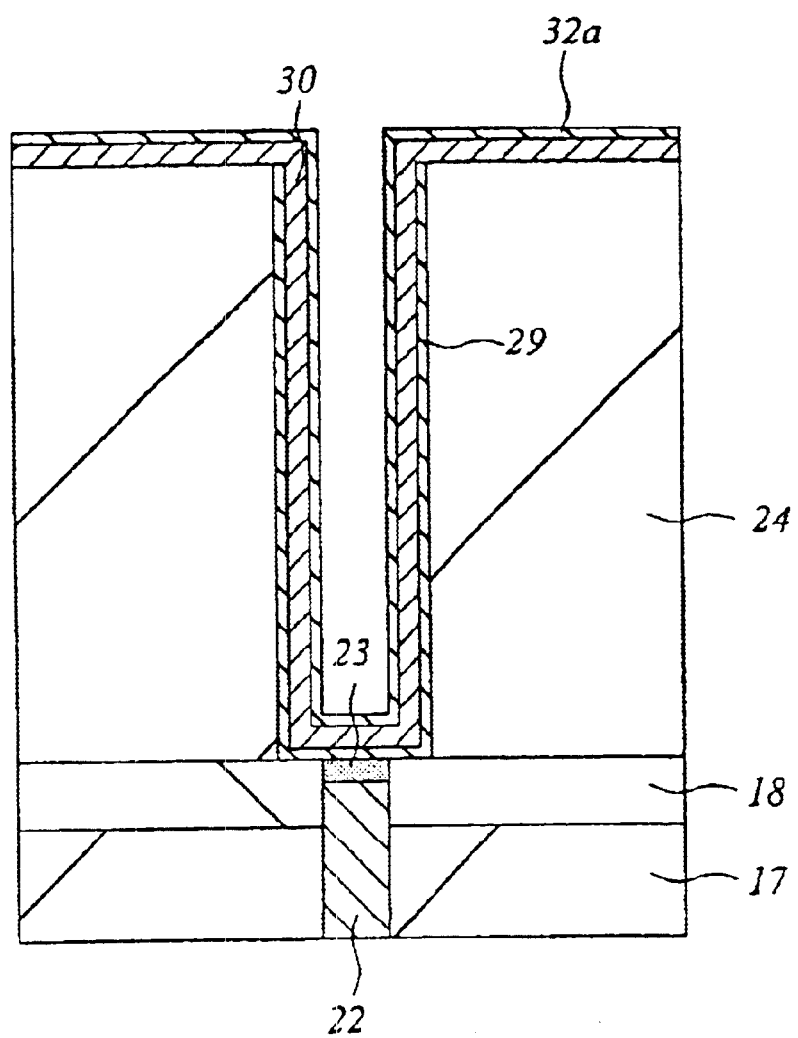
FIG. 22 is a cross-sectional view of a principal portion of a semiconductor substrate for illustrating a process for manufacturing a semiconductor integrated circuit device that is the second embodiment of the present invention.
Figure 23:
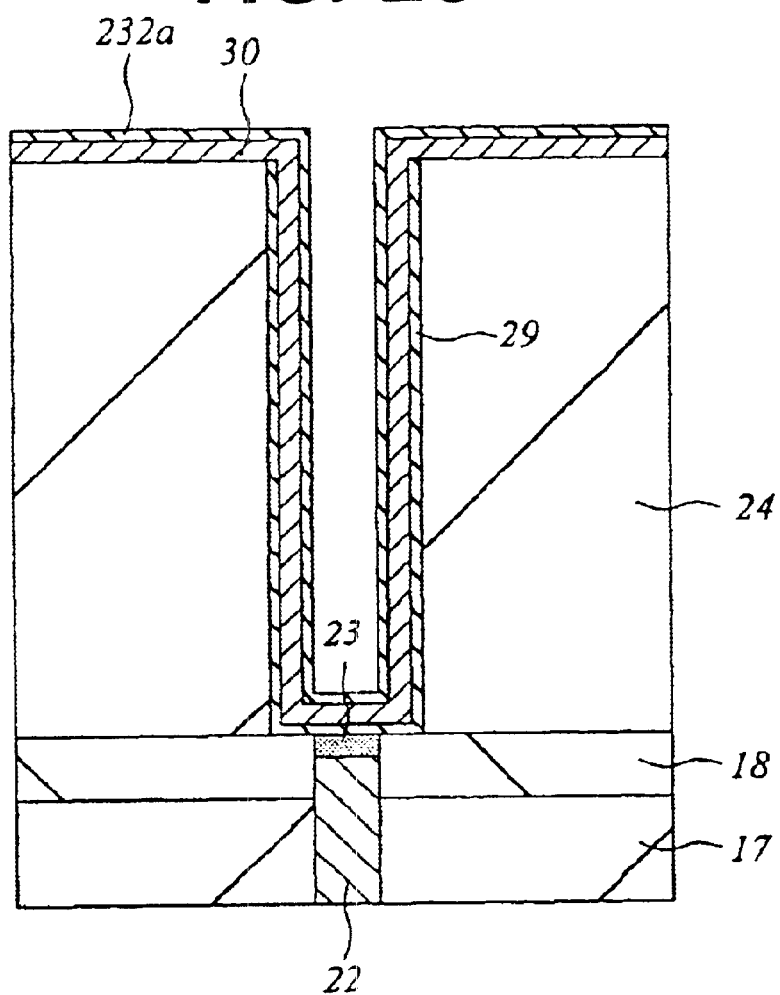
FIG. 23 is a cross-sectional view of a principal portion of a semiconductor substrate for illustrating a process for manufacturing a semiconductor integrated circuit device that is the second embodiment of the present invention.

As shown in FIG. 22, a tantalum oxide film 32a constituting a capacitive insulating film is deposited on the Ru film 30. The tantalum oxide film 32a is deposited by a CVD method using pentaethoxy tantalum ($Ta(OC_2H_5)_5$) and oxygen as materials and a temperature for forming the film is 420° C. And, the tantalum oxide film 32a has a film thickness of about 5 nm. Thereafter, heat treatment is performed at 700° C. for 2 minutes in reducing atmosphere such as NH$_3$ atmosphere or the like. At this time, the tantalum oxide film 32a is converted to a tantalum nitride film 232a (see FIG. 23). Thus, in the present embodiment, since heat treatment is performed in reducing atmosphere after the tantalum oxide film 32a is formed, it is possible to remove oxygen taken in the Ru film during formation of the tantalum oxide film 32a.

Figure 24:
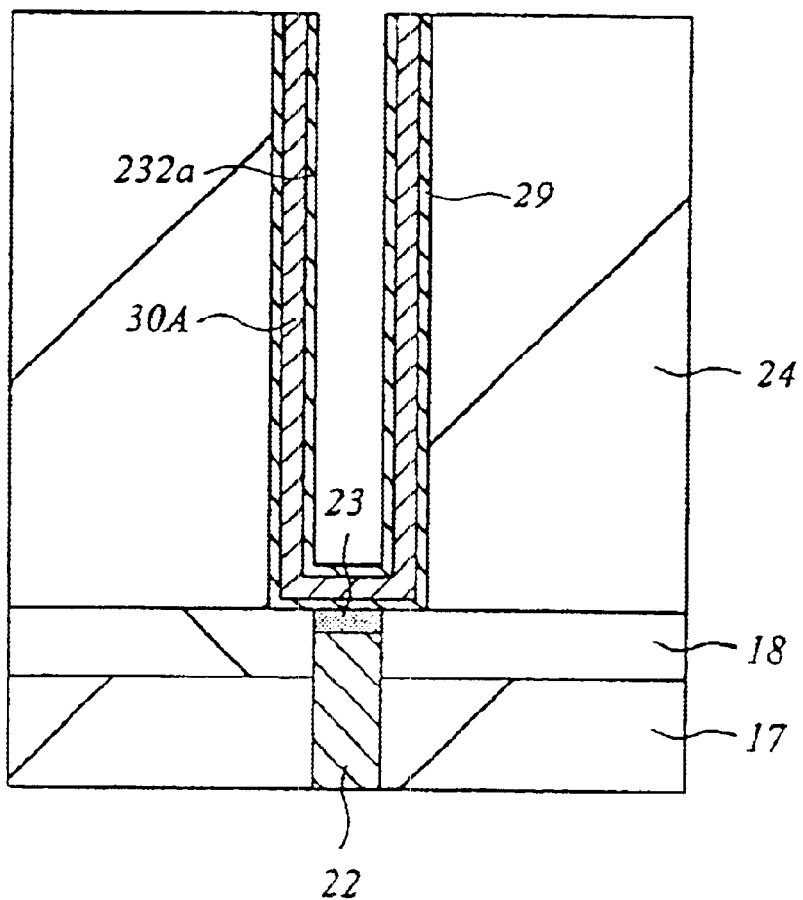
FIG. 24 is a cross-sectional view of a principal portion of a semiconductor substrate for illustrating a process for manufacturing a semiconductor integrated circuit device that is the second embodiment of the present invention.

Subsequently, the tantalum nitride film 232a is coated with a photoresist film (not shown). All surfaces of this photoresist film are exposed. Thereafter, the photoresist film (not shown) is made to remain in the aperture 27 by development thereof. Then, as shown in FIG. 24, by performing dry etch using this photoresist film as a mask and by removing the Ru film 30 and the tantalum nitride film 232a located on the silicon oxide film 24, the lower electrode 30A is formed. Then, the photoresist film located in the aperture 27 is removed (see FIG. 24).

Figure 25:
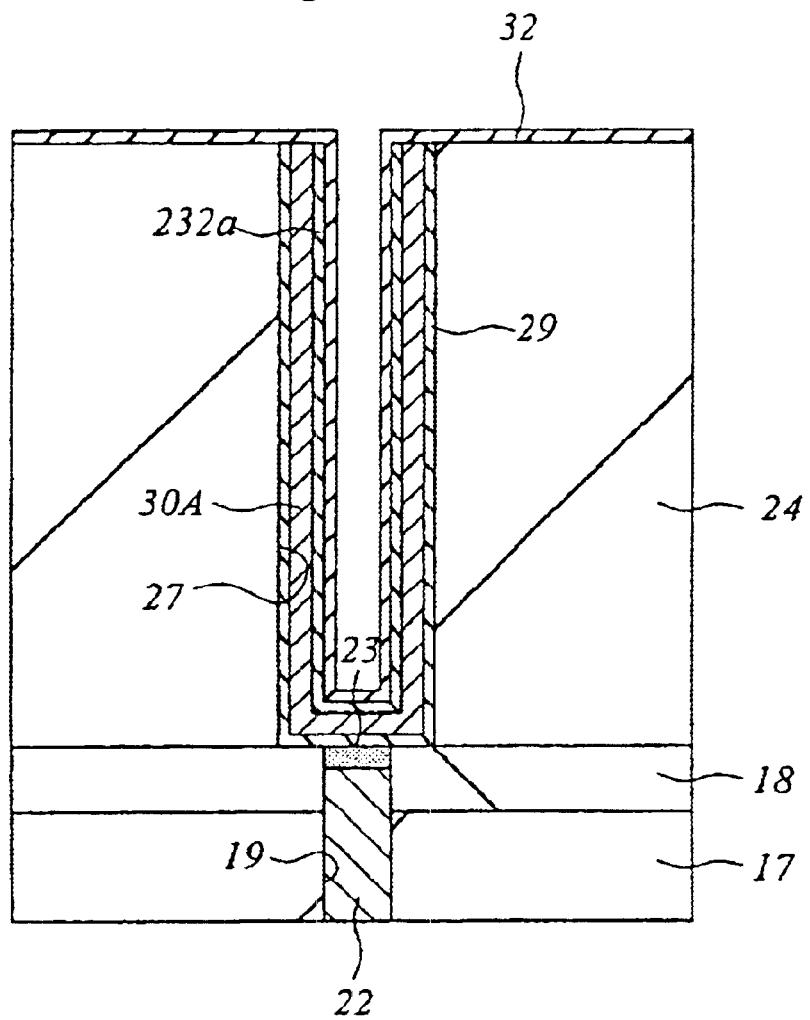
FIG. 25 is a cross-sectional view of a principal portion of a semiconductor substrate for illustrating a process for manufacturing a semiconductor integrated circuit device that is the second embodiment of the present invention.

As FIG. 25 shows, a tantalum oxide film 32 constituting a capacitive insulating film is deposited on the silicon oxide film 24 and in the aperture 27 in which the lower electrode 30A and the tantalum nitride film 232a are formed. The tantalum oxide film 32 is deposited by a CVD method using pentaethoxy tantalum (Ta(OC$_2$H$_5$)$_5$) and oxygen as materials, and a temperature for forming the film is 420° C. And, a film thickness thereof is about 15 nm. Thereafter, heat treatment is performed at 700° C. for 2 minutes in non-reducing atmosphere and thereby the tantalum oxide film 32 is crystallized.

Figure 26:
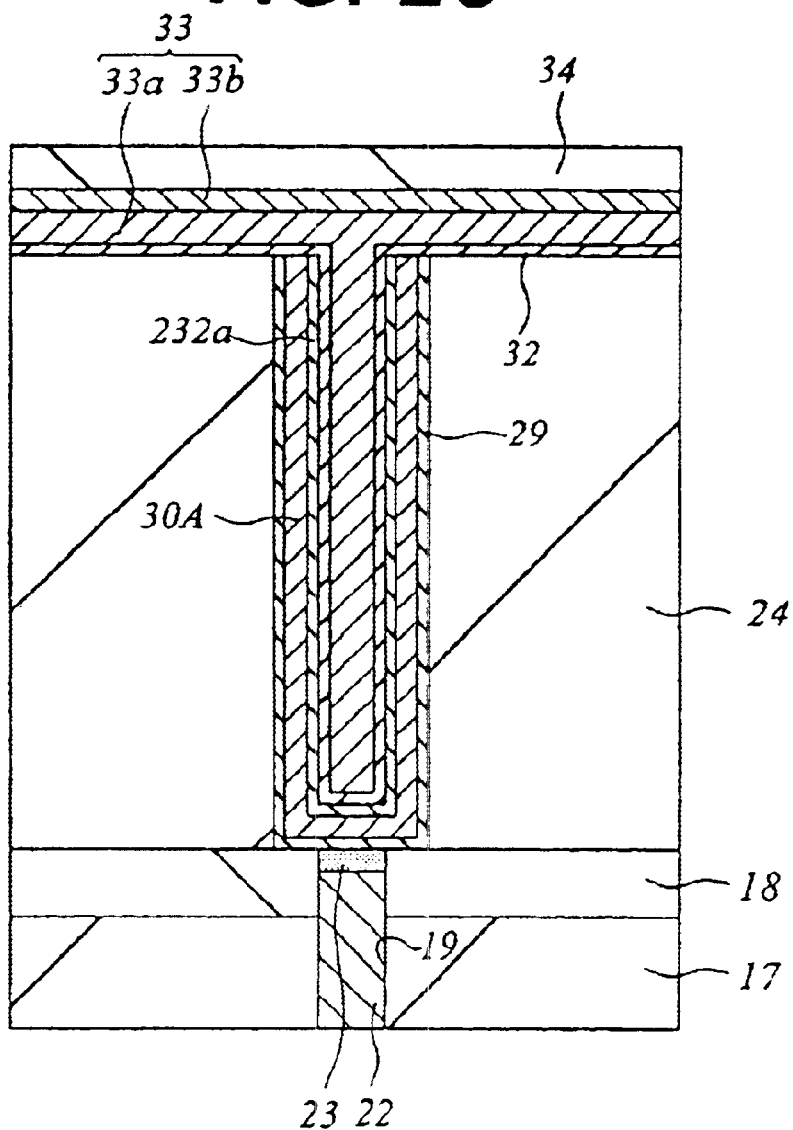
FIG. 26 is a cross-sectional view of a principal portion of a semiconductor substrate for illustrating a process for manufacturing a semiconductor integrated circuit device that is the second embodiment of the present invention.

Next, as shown in FIG. 26, the upper electrode 33 is formed on the tantalum oxide film 32. The upper electrode 33 is formed, for example, by depositing a Ru film 33a (having a film thickness of about 70 nm) and a W film 33b (having a film thickness of about 100 nm) over the tantalum oxide film 32 by a CVD method. The W film 33b is provided for the purpose of decreasing contact resistance between the upper electrode 33 and an upper-layer wiring thereof. A TiN film may be formed between the Ru film 33a and the W film 33b in order to prevent resistance increase caused by diffusion of gas (oxygen or hydrogen) into the W film from the capacitive insulating film (tantalum oxide film 32).

According to processes described above, the information storing capacitive element C is completed, which comprises the lower electrode 30A formed of the Ru film 30, and the capacitive insulating film formed of the tantalum oxide film 32, and the upper electrode 33 formed of the W film/the Ru film. And, a memory cell of a DRAM is nearly completed, which is constituted by the memory cell selecting MISFET Qs and the information storing capacitive element C connected in series thereto.

Thereafter, an inter-layer insulating film 34 formed of silicon oxide or the like is formed on the information storing capacitive element C. Additionally, about two layers of Al wiring are formed on the inter-layer insulating film, and a passivation film is formed on an uppermost layer of Al wiring, but a drawing illustrating this structure will be omitted.

As described above in detail, according to the present embodiment, a Ru film has a laminating structure (the Ru film 30) of the Ru film 30a and the Ru film 30b, and the heat treatment is performed after the Ru films 30a and 30b are formed respectively. Therefore, it is possible to remove effectively impurities included in the Ru film. As a result, fineness of the Ru film can be achieved.

Accordingly, similarly to the first embodiment, it is possible to prevent the barrier layer 23 being in contact with the Ru film from being oxidized by affection of oxygen included in the Ru film. And, electrical contact can be achieved between the Ru film 30 and the barrier layer 23 (each plug 22).

Furthermore, since the Ru film 30 is made fineness, it is possible to prevent shrinkage and change of the Ru film 30 (30A) during heat treatment for forming the tantalum oxide film 32 formed thereon, and to reduce deformation of the tantalum oxide film 32. As a result, it is possible to achieve reduction of leakage current.

Moreover, after the tantalum oxide film 32a is formed, heat treatment is performed in reducing atmosphere. Therefore, it is possible to remove oxygen taken in the Ru film during formation of the tantalum oxide film 32a, and to prevent electrical contact failure caused by affection of this oxygen, and also to form the tantalum oxide film 32 having a smoother surface than otherwise.

(Third Embodiment)

In the first embodiment, the deep aperture 27 is formed after the barrier layer 23 formed of tantalum nitride or titanium nitride is formed on the surface of each plug 22. Instead, a ruthenium silicon nitride (RuSiN) film 323a constituting the barrier layer may be formed over each plug 22 after the deep aperture 27 is formed.

A process of manufacturing a DRAM that is the present embodiment will be described below in process order with reference to FIGS. 27 to 36.

Figure 27:
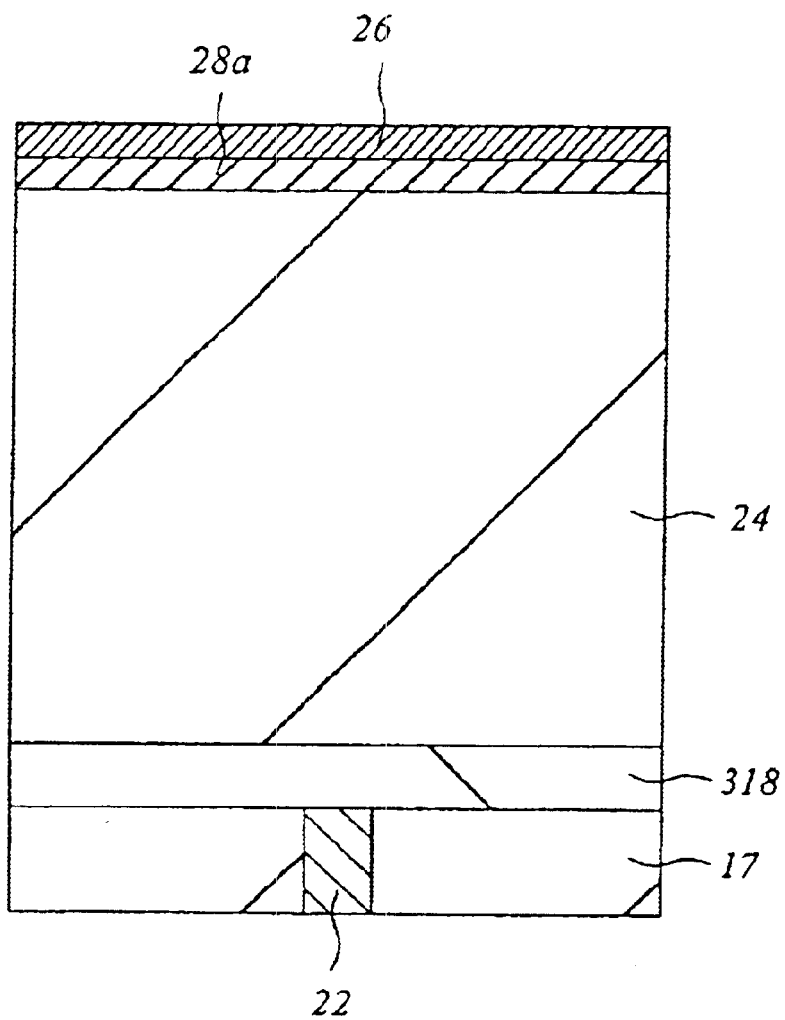
FIG. 27 is a cross-sectional view of a principal portion of a semiconductor substrate for illustrating a process for manufacturing a semiconductor integrated circuit device that is a third embodiment of the present invention.

FIG. 27 is a cross-sectional view of a principal portion of a semiconductor substrate for showing a process for manufacturing the semiconductor integrated circuit device that is a third embodiment of the present invention.

In the present embodiment, a step of forming each plug 22 shown in the drawings is the same as the case of the first embodiment described with reference to FIGS. 1 to 7, and description thereof will be omitted. In the present embodiment, the insulating film in which each plug 22 is embedded is composed of one layer of the silicon oxide film 17.

As shown in FIG. 27, a silicon nitride film 318, a silicon oxide film 24, and a tantalum oxide film 28a are deposited over each plug 22 and the silicon oxide film 17. The lower electrode of the information storing capacitive element C will be formed in an aperture (recess) provided in the silicon nitride film 318 and silicon oxide film 24 in the following step. In order to enlarge surface area of the lower electrode and to increase amounts of electric charge stored, it is necessary to deposit thick the silicon oxide film 24 (up to a film thickness of about 0.8 $\mu$m). The silicon oxide film 24 is deposited, for example, by a plasma CVD method using oxygen and tetraethoxysilane (TEOS) as source gas. Thereafter, if necessary, a surface thereof may be made planarization by a chemical mechanical polishing method.

Next, a hard mask 26 formed of tungsten film is formed over the tantalum oxide film 28a. The hard mask 26 may be formed of metal other than tungsten.

Figure 28:
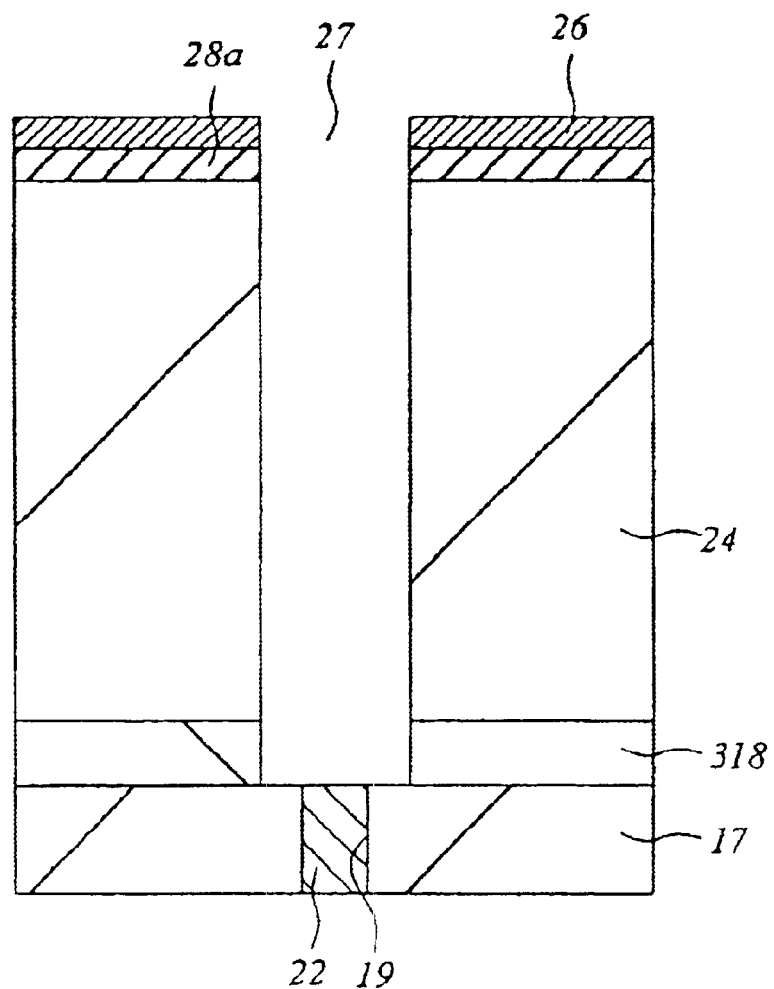
FIG. 28 is a cross-sectional view of a principal portion of a semiconductor substrate for illustrating a process for manufacturing a semiconductor integrated circuit device that is the third embodiment of the present invention.
Figure 29:
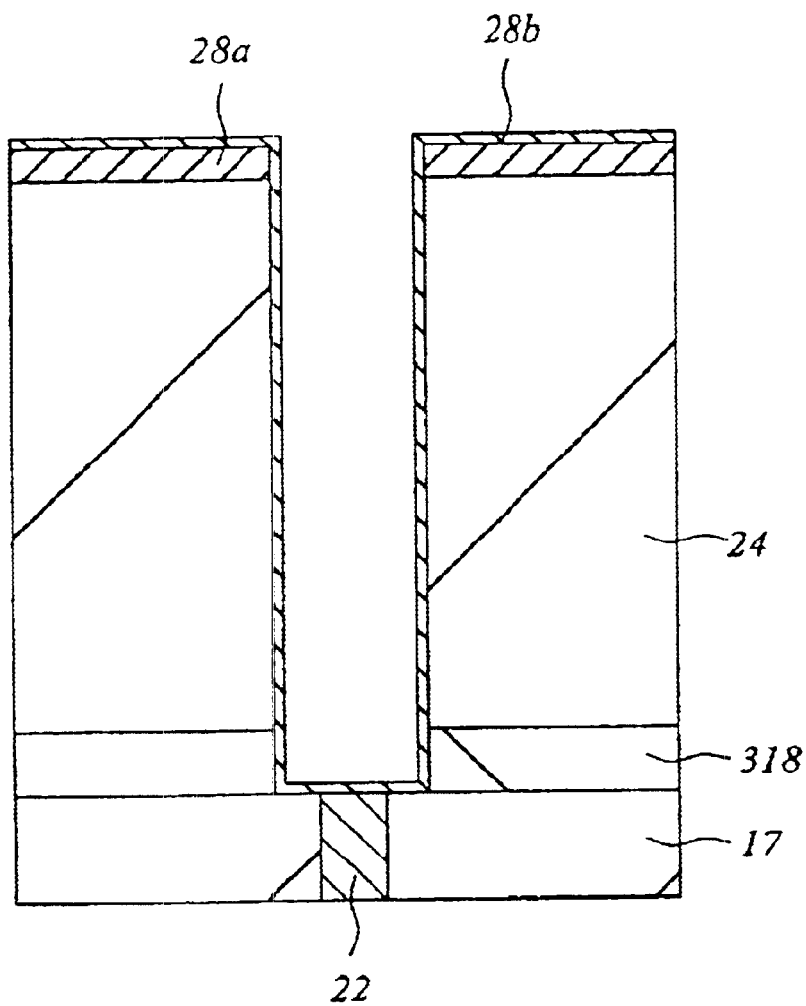
FIG. 29 is a cross-sectional view of a principal portion of a semiconductor substrate for illustrating a process for manufacturing a semiconductor integrated circuit device that is the third embodiment of the present invention.
Figure 30:
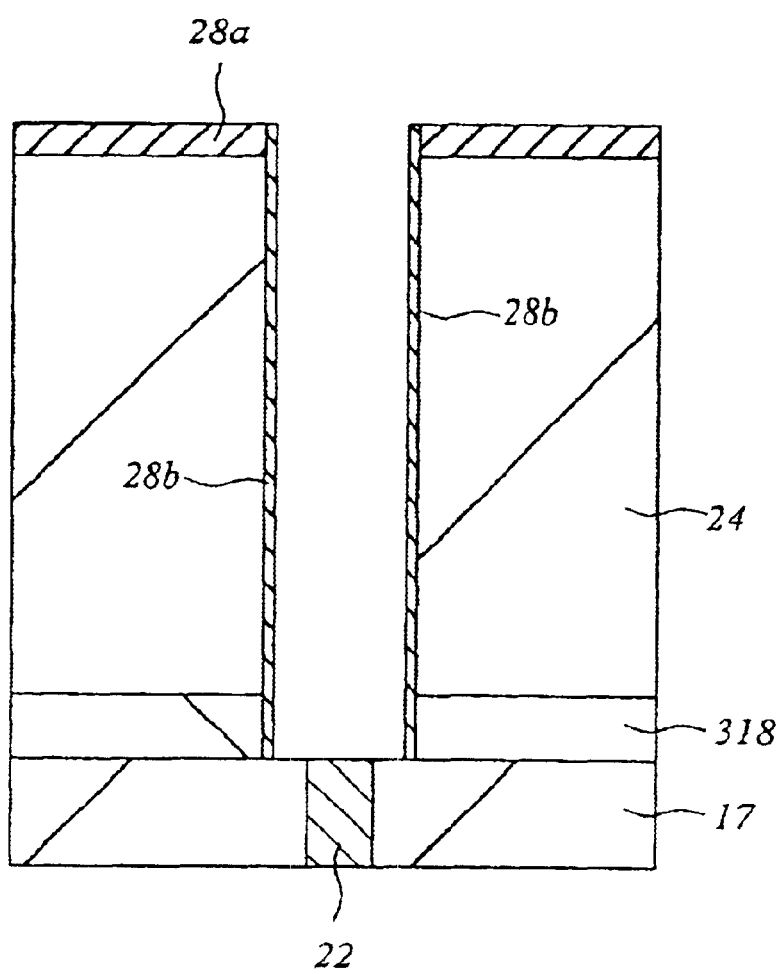
FIG. 30 is a cross-sectional view of a principal portion of a semiconductor substrate for illustrating a process for manufacturing a semiconductor integrated circuit device that is the third embodiment of the present invention.

Subsequently, as shown in FIG. 28, a photoresist film (not shown) is formed on the hard mask 26. The hard mask 26 is dry-etched by using the photoresist film as a mask. Then, by using the hard mask 26 as a mask and by dry-etching the tantalum oxide film 28a, the silicon oxide film 24 and the silicon nitride film 318 are dry-etched, a deep aperture (recess) 27 is formed. A surface of each plug 22 located in each through hole 19 is thereby exposed at the bottom surface of the deep aperture 27. Next, the hard mask 26 remaining on the tantalum oxide film 28a is removed by using a solution containing hydrogen peroxide solution. Thereafter, as shown in FIG. 29, a tantalum oxide film 28b (having a film thickness of about 5 nm) is deposited on the tantalum oxide film 28a and in the deep aperture 27 by a CVD method. This tantalum film can be formed within a temperature range of 400° C. to 450° C. by using Ta(OC$_2$H$_5$)$_5$ and O$_2$ as material gas. This tantalum oxide film 28a is utilized as an adhesive layer because having a superior adhesive characteristic relative to the silicon oxide film 24 being a base thereof and a Ru film 30a described later. Subsequently, as shown in FIG. 30, by anisotropic etching the tantalum oxide film 28b, the tantalum oxide film 28b located on an upper portion of the tantalum oxide film 28a and a bottom portion of the aperture 27 is removed and the tantalum oxide film 28b is made to remain only in a side wall of the aperture 27.

Figure 31:
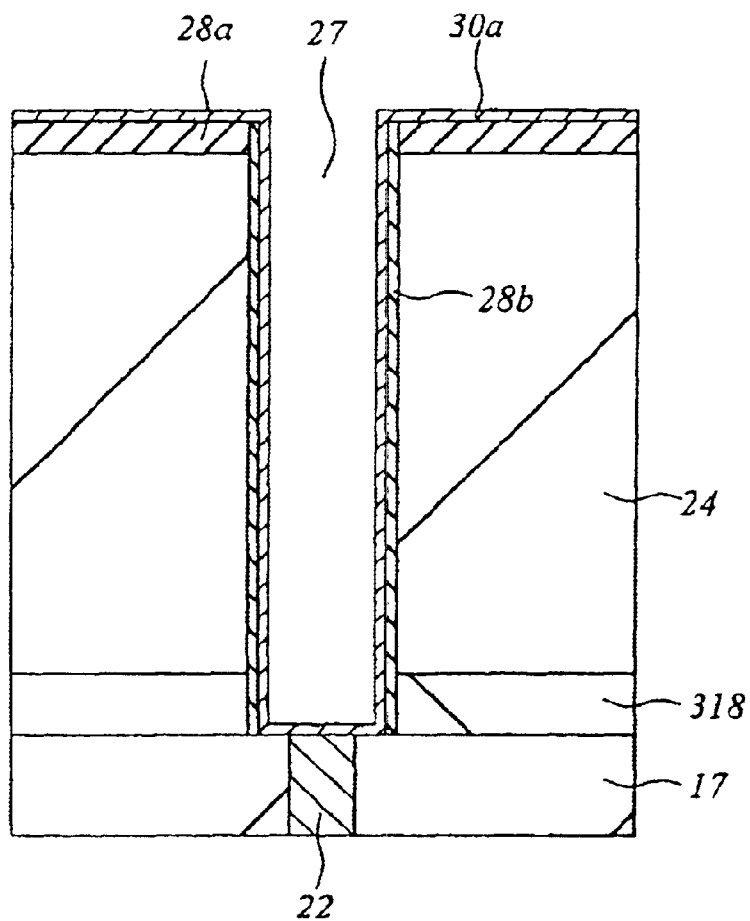
FIG. 31 is a cross-sectional view of a principal portion of a semiconductor substrate for illustrating a process for manufacturing a semiconductor integrated circuit device that is the third embodiment of the present invention.

Next, as shown in FIG. 31, a Ru film 30a (having a film thickness of about 5 nm) is deposited over the tantalum oxide film 28a and 28b provided in the deep aperture (recess) 27. The Ru film 30a is formed by evaporating a solution of a Ru organic compound such as a tetrahydrofuran solution or the like containing ethylcyclopenta-dienyl ruthenium (Ru(C$_2$H$_5$C$_5$H$_4$)$_2$) and by being made to react with O$_2$. A thin Ru film may be formed by a sputtering method before the Ru film 30a is formed by this CVD method. If so, the thin Ru film formed by a sputtering method serves as a seed, so that it is possible to form efficiently the Ru film by a CVD method.

Figure 32:
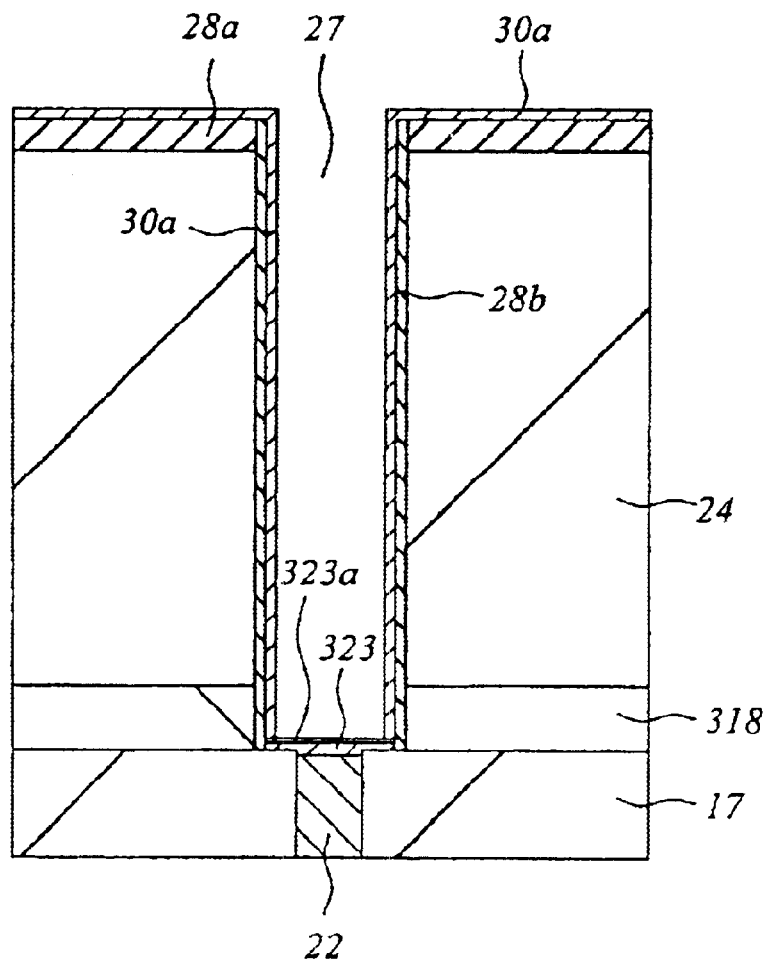
FIG. 32 is a cross-sectional view of a principal portion of a semiconductor substrate for illustrating a process for manufacturing a semiconductor integrated circuit device that is the third embodiment of the present invention.

As shown in FIG. 32, heat treatment is performed at 600° C. for one minute in non-oxidizing atmosphere. By this heat treatment, silicide formation reaction takes place in a contact portion between each plug 22 and the Ru film 30a, so that a ruthenium silicide film 323 is formed on the bottom portion of the aperture 27. In this case, no ruthenium silicide is formed in the side wall of the aperture 27 and outside the aperture 27 because silicon which becomes a base thereof is not included in the side wall of the aperture 27 and outside the aperture 27 and thereby silicide formation reaction does not take place. Thus, it is possible to form the ruthenium silicide film 323 on the bottom surface of the aperture 27 in self-alignment.

Thereafter, heat treatment is performed at 600° C. for 3 minutes in NH$_3$ atmosphere. A ruthenium silicon nitride (RuSiN) film 323a is thereby formed on the surface of the ruthenium silicide film 323. The RuSiN film formed under these conditions has a film thickness of about 1 nm. The film thickness of the RuSiN film can be controlled by a temperature capable of performing heat treatment. If the RuSiN film is too thick, electrical contact between the Ru film 30b to be formed over the RuSiN film and each plug 22 (ruthenium silicide film 323) is not ensured. And, silicide formation reaction can not be restrained, which takes place in the too thin Ru film 30b and each plug 22. In order to ensure electrical contact between the Ru film 30b and each plug 22 and to restrain the silicide formation reaction in the plug 22 and the Ru film 30b, it is desired that the RuSiN film has a film thickness of about 0.5 to 1.0 nm.

Subsequently, heat treatment is performed at 750° C. for 1 minute in non-oxidizing atmosphere, and fineness of the Ru film 30a not reacted is thereby achieved.

Figure 33:
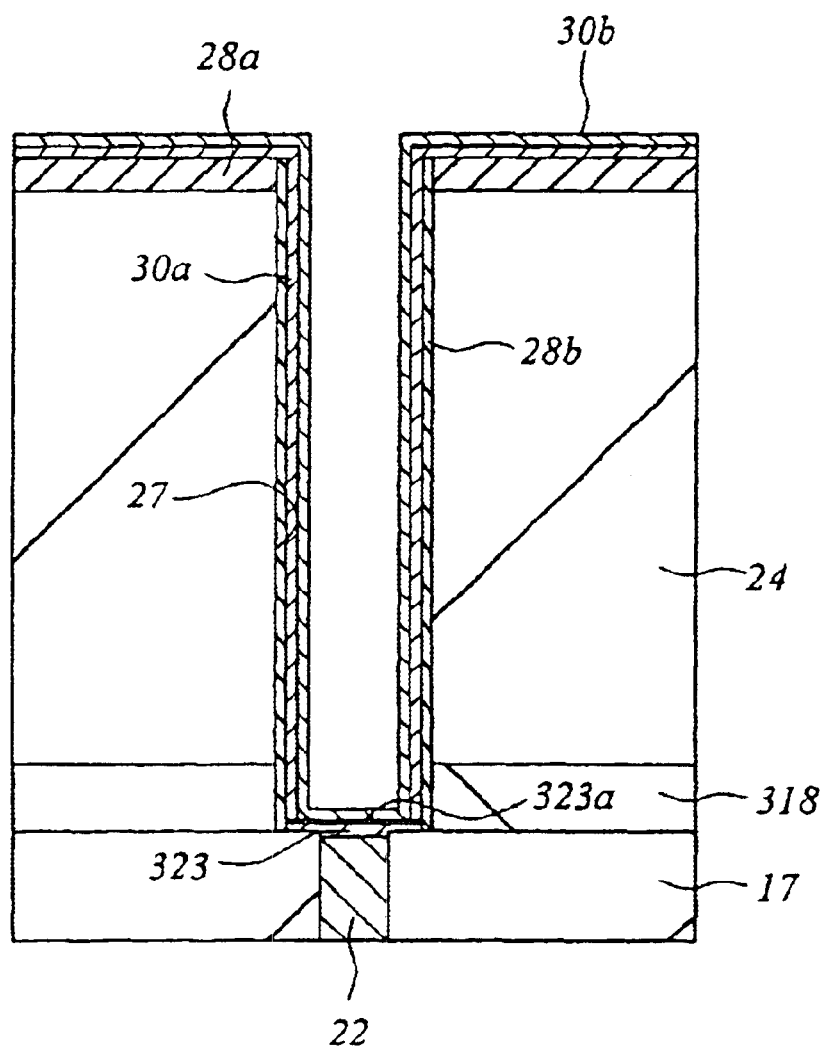
FIG. 33 is a cross-sectional view of a principal portion of a semiconductor substrate for illustrating a process for manufacturing a semiconductor integrated circuit device that is the third embodiment of the present invention.
Figure 34:
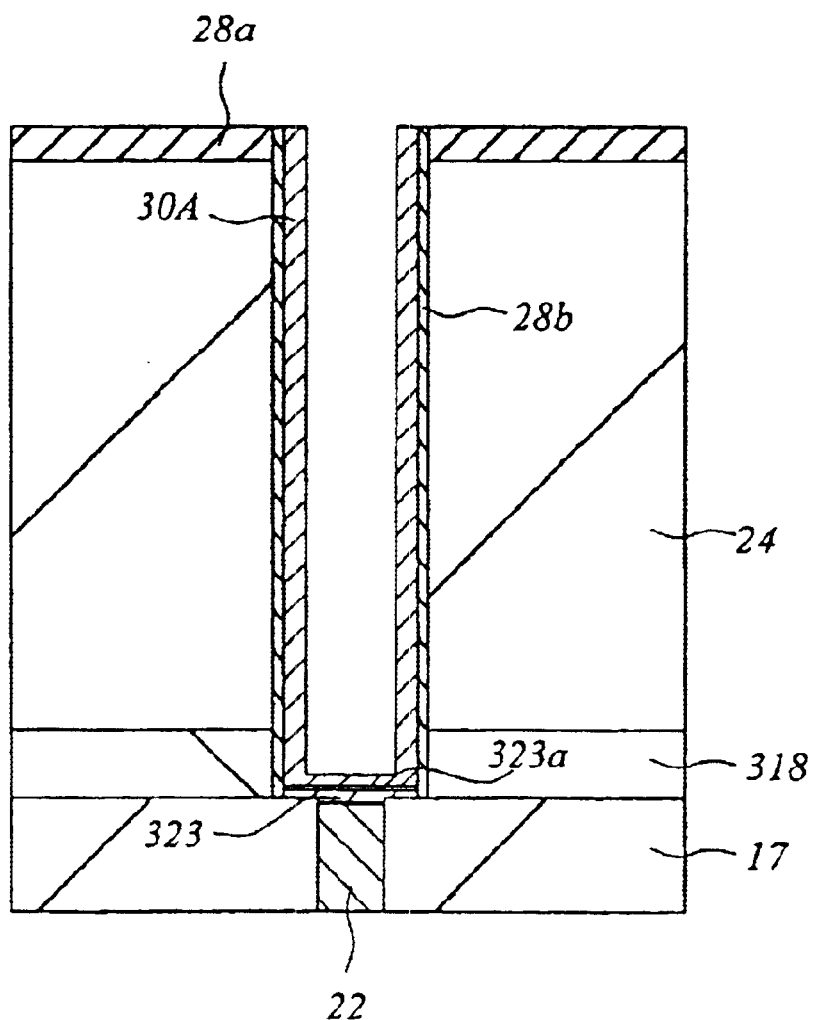
FIG. 34 is a cross-sectional view of a principal portion of a semiconductor substrate for illustrating a process for manufacturing a semiconductor integrated circuit device that is the third embodiment of the present invention.

As shown in FIG. 33, a Ru film 30b having a film thickness of about 20 nm is further deposited on the Ru film 30a and the RuSiN film 323a under the same conditions as the Ru film 30a having been deposited. This Ru film 30b contains a little amount of impurities and is formed on the Ru film 30a made fineness. Hence, it is possible to omit heat treatment (for example, heat treatment of being performed at 750° C. for 2 minutes in non-oxidizing atmosphere) of making the Ru film 30b fineness. However, in the present embodiment, since the Ru film 30b is formed even on the RuSiN film 323a that does not work as a crystallization seed, heat treatment is preferably performed for fineness described above.

Thus, in the present embodiment, the ruthenium silicide film 323 can be formed in self-alignment on the bottom surface of the aperture 27. Further, the Ru film has a laminating structure of the Ru films 30a and 30b, and heat treatment is performed after the Ru films 30a and 30b are formed respectively. Hence, it is possible to remove effectively impurities included in the Ru film. As a result, fineness of the Ru film (30A) can be achieved.

Subsequently, the Ru film 30b is coated with a photoresist film (not shown) and all surfaces of the photoresist film are exposed. Thereafter, the photoresist film (not shown) is made to remain in the aperture 27 by development thereof. When the unused Ru films 30a and 30b located on the tantalum oxide film 28a in the following step are removed by dry etch, this photoresist film is utilized as a protective film for preventing the Ru films 30a and 30b located in the aperture 27 from being removed. Subsequently, by performing dry etch using this photoresist film as a mask and by removing the Ru films 30a and 30b located on the tantalum oxide film 28a, the lower electrode 30A is formed. Then, the photoresist film located in the aperture 27 is removed (see FIG. 34).

Figure 35:
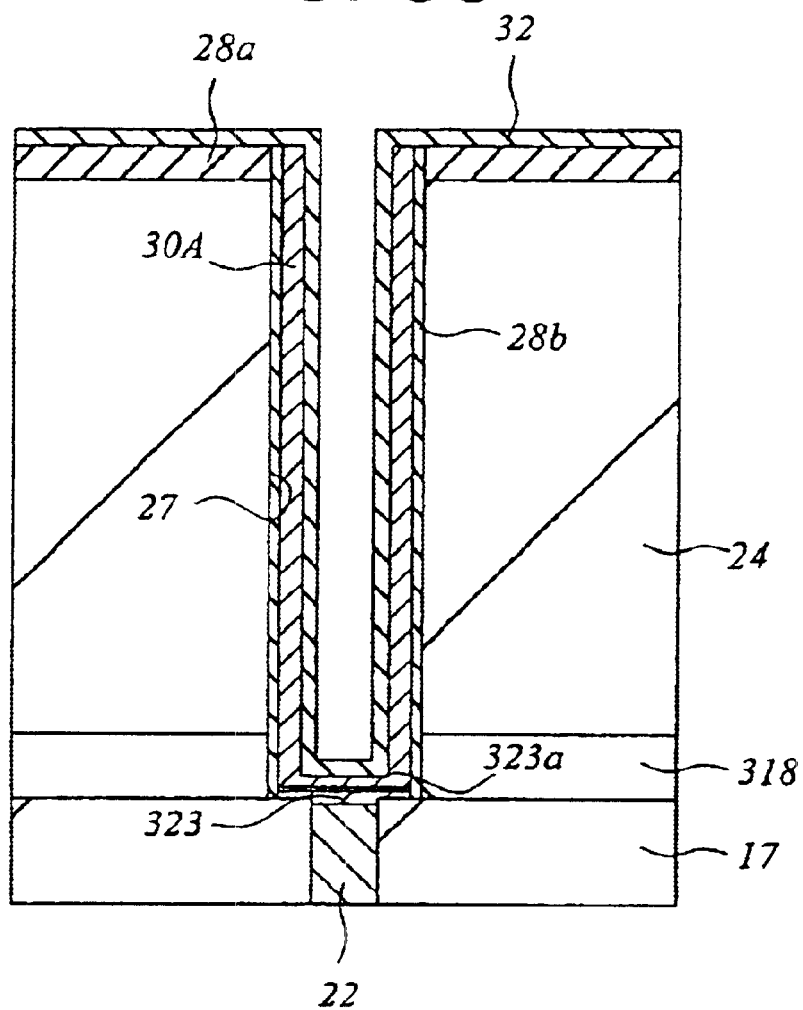
FIG. 35 is a cross-sectional view of a principal portion of a semiconductor substrate for illustrating a process for manufacturing a semiconductor integrated circuit device that is the third embodiment of the present invention.

Next, as shown in FIG. 35, a tantalum oxide film 32 constituting a capacitive insulating film is deposited in the silicon oxide film 24 and in the aperture 27 in which the lower electrode 30A is formed. The tantalum oxide film 32 is deposited by a CVD method and has a film thickness of about 15 nm.

Next, the tantalum oxide film 32 is heat-treated at about 700° C. for 2 minutes in nitrogen atmosphere, and the tantalum oxide film 32 is thereby crystallized. Thereafter, film quality of the tantalum oxide film is improved by performing heat treatment at about 550° C. for one minute in oxygen atmosphere.

Figure 36:
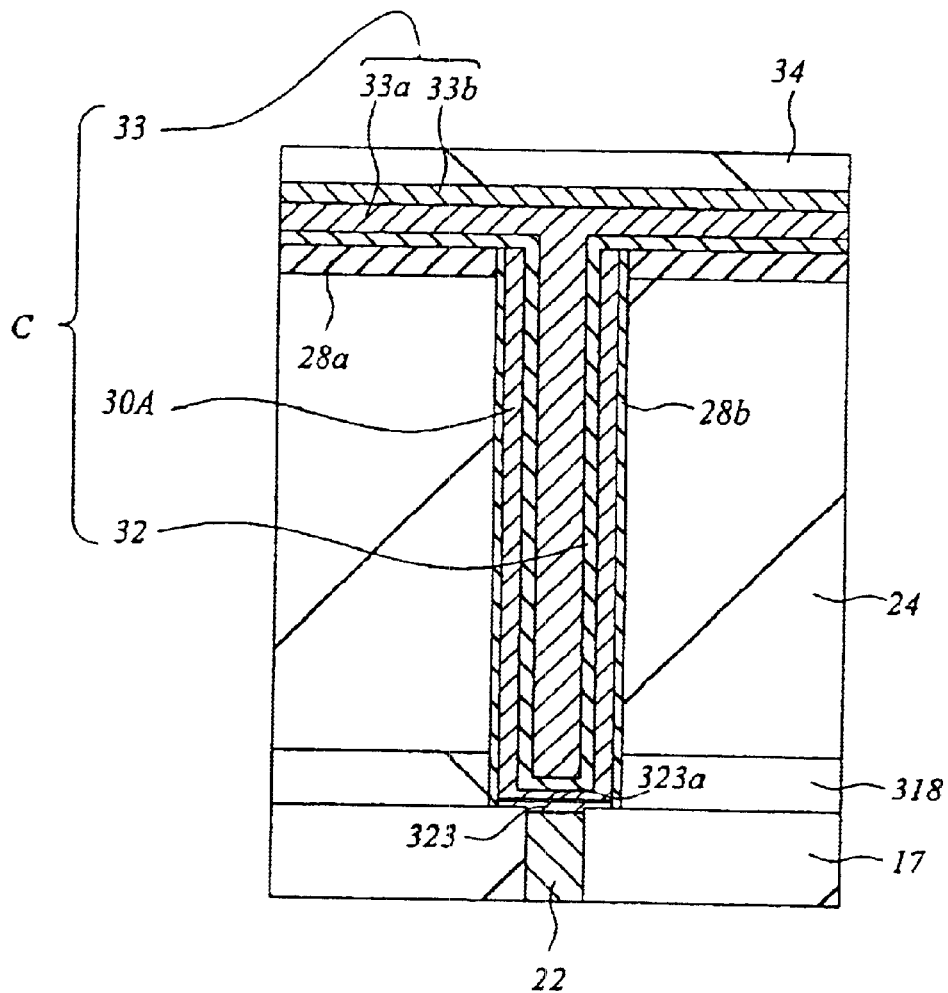
FIG. 36 is a cross-sectional view of a principal portion of a semiconductor substrate for illustrating a process for manufacturing a semiconductor integrated circuit device that is the third embodiment of the present invention.

Next, as shown in FIG. 36, the upper electrode 33 is formed on the tantalum oxide film 32. The upper electrode 33 is formed, for example, by depositing a Ru film 33a (having a film thickness of about 70 nm) and a W film 33b (having a film thickness of about 100 nm) on the tantalum oxide film 32 by a CVD method. The W film 33b is provided for the purpose of reducing contact resistance between the upper electrode 33 and an upper-layer wiring thereof. A TiN film may be formed between the Ru film 33a and the W film 33b to prevent resistance increase caused by diffusion of gas (oxygen or hydrogen) into the W film 33b from the capacitive insulating film (tantalum oxide film 32).

Thus far, from processes described above, the information storing capacitive element C is completed, which comprises the lower electrode 30A formed of the Ru films 30a and 30b, and the capacitive insulating film formed of the tantalum film 32, and the upper electrode 33 formed of the W film 33b/the Ru film 33a. And, a memory cell of a DRAM is nearly completed, which is constituted by a memory cell selecting MISFET Qs and an information storing capacitive element C connected in series thereto.

Thereafter, an inter-layer insulating film 34 formed of silicon oxide film or the like is formed on the information storing capacitive element C.

Further, about two layers of Al wiring are formed on the inter-layer insulating film, and a passivation film is formed on an uppermost layer of Al wiring. However, a drawing illustrating this structure will be omitted.

As described above in detail, in the present embodiment, it is possible to form the ruthenium silicide film 323 in self-alignment on the bottom surface of the aperture 27, and to form easily the RuSiN film 323a constituting a barrier layer. And, the Ru film has a laminating structure of the Ru films 30a and 30b, and heat treatment is performed after the Ru films 30a and 30b are formed. Therefore, it is possible to remove effectively impurities included in the Ru film. As a result, fineness of the Ru film can be achieved.

Hence, similarly to the case of the first embodiment, it is possible to prevent the barrier layer (323a) being in contact with the Ru films 30a and 30b from being oxidized by affection of oxygen included in the Ru films 30a and 30b. Electrical contact can be therefore ensured between each of the Ru films 30a and 30b and the barrier layer 323a (each plug 22), on the other.

Since the Ru films 30a and 30b (30A) are made fine, it is possible to prevent shrinkage and change of the Ru film caused by heat treatment performed during formation of the tantalum oxide film 32 formed thereon and to reduce deformation in the tantalum oxide film 32. As a result, reduction of leakage current can be achieved.

In the present embodiment, the Ru film 30b is formed after the Ru film 30a is silicified and the ruthenium silicon nitride (RuSiN) film 323a is formed. Alternatively, the tantalum oxide film 32 may be formed over the Ru film 30a and the ruthenium silicon nitride (RuSiN) film 323a (see FIG. 32) without forming this Ru film 30b. In this case, the amorphous tantalum oxide film 32 will be formed on the RuSiN film 323a that does not work as a crystallization seed. However, since most capacity of the information storing capacitive element C can be ensured by the tantalum oxide film 32 crystallized in the side wall of the aperture 27, existence of the amorphous tantalum oxide film described above has nothing to do with a characteristic of the information storing capacitive element C.

(Fourth Embodiment)

Next, the case where an adhesive layer and a barrier layer are formed in the same layer will be described.

A process for manufacturing the DRAM, which is the present embodiment, will be described in process order with reference to FIGS. 37 to 46.

Figure 37:
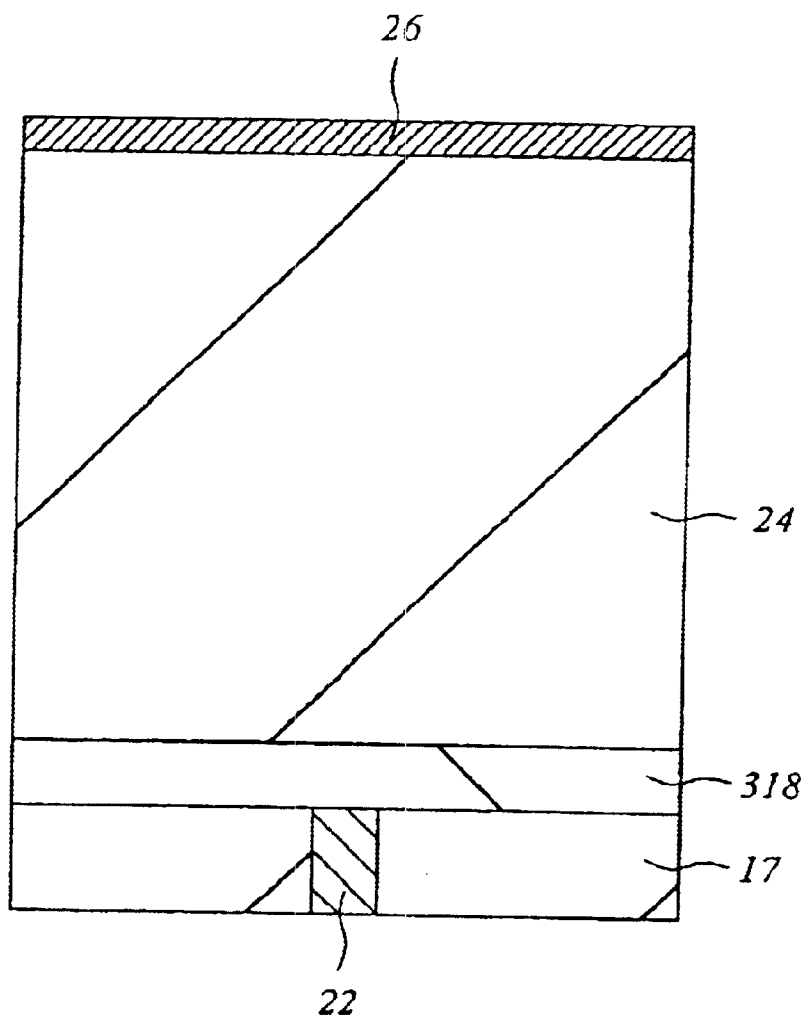
FIG. 37 is a cross-sectional view of a principal portion of a semiconductor substrate for illustrating a process for manufacturing a semiconductor integrated circuit device that is a fourth embodiment of the present invention.

FIG. 37 is a cross-sectional view of a principal portion of a semiconductor substrate for illustrating a process for manufacturing the semiconductor integrated circuit device that is a fourth embodiment. In this embodiment, since a step of forming the plugs 22 illustrated in the drawings is the same as the case of the first embodiment described with reference to FIGS. 1 to 7, description of this structure will be omitted. In the present embodiment, the insulating film in which each plug 22 is embedded is composed of one layer of the silicon oxide film 17.

As shown in FIG. 37, a silicon nitride film 318 and a silicon oxide film 24 are deposited over both the plug 22 and the silicon oxide film 17. The lower electrode of the information storing capacitive element C is formed in an aperture (recess) provided in the silicon nitride film 318 and silicon oxide film 24. In order to enlarge surface area of the lower electrode and increase amounts of electric charge stored thereon, it is necessary to deposit thin the silicon oxide film 24 (up to a film thickness of about 0.8 $\mu$m). The silicon oxide film 24 is deposited, for example, by a plasma CVD method using oxygen and tetraethoxysilane (TEOS) as source gas. Thereafter, if necessary, a surface of the silicon oxide film 24 is made planarization by a chemical mechanical polishing method.

Next, a hard mask 26 formed of tungsten film is formed over the silicon oxide film 24. The hard mask 26 may be formed of metals other than tungsten.

Figure 38:
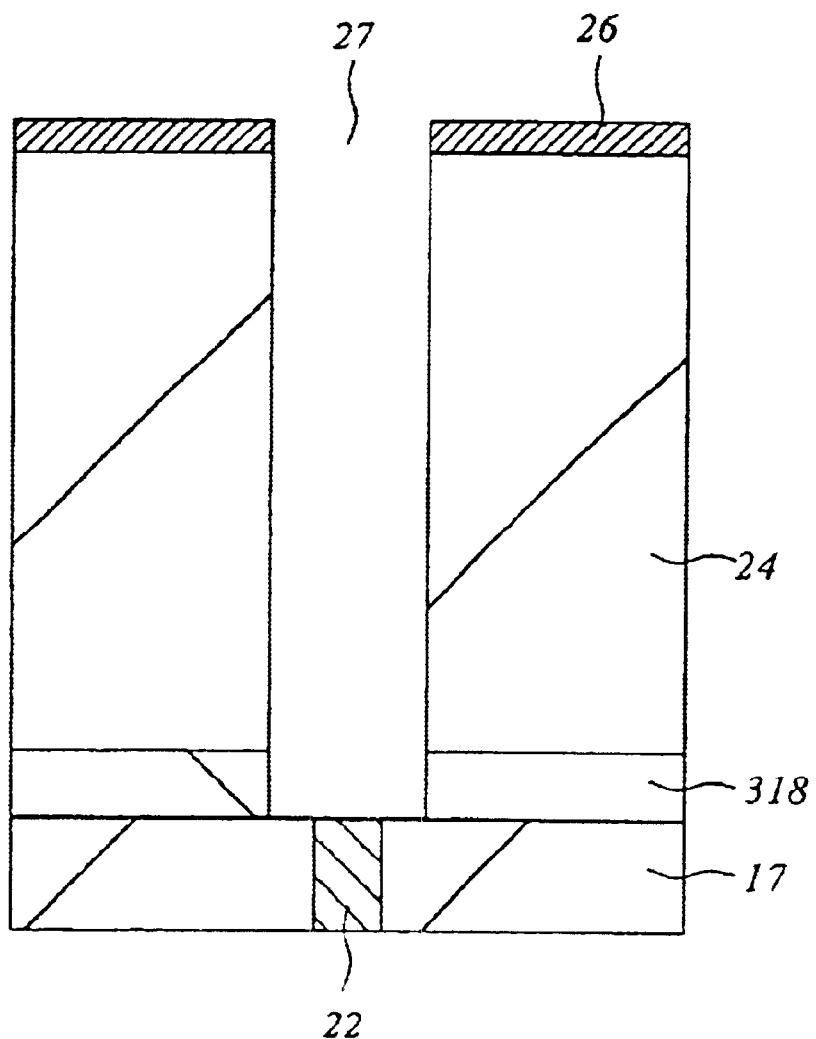
FIG. 38 is a cross-sectional view of a principal portion of a semiconductor substrate for illustrating a process for manufacturing a semiconductor integrated circuit device that is the fourth embodiment of the present invention.
Figure 39:
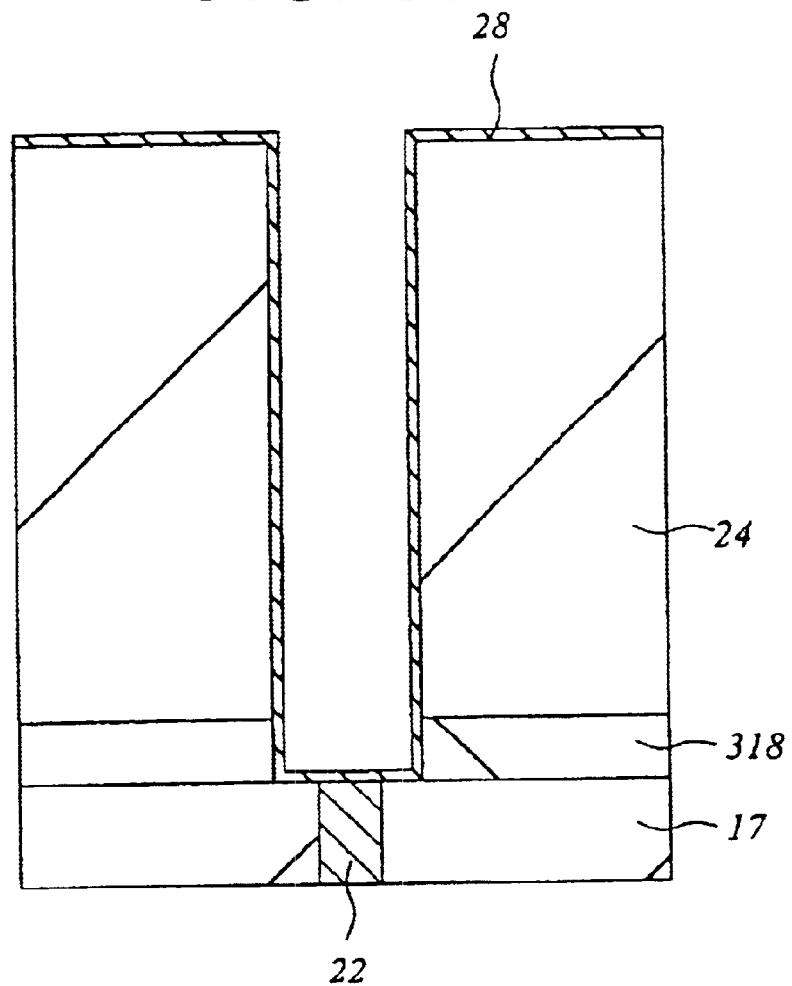
FIG. 39 is a cross-sectional view of a principal portion of a semiconductor substrate for illustrating a process for manufacturing a semiconductor integrated circuit device that is the fourth embodiment of the present invention.
Figure 40:
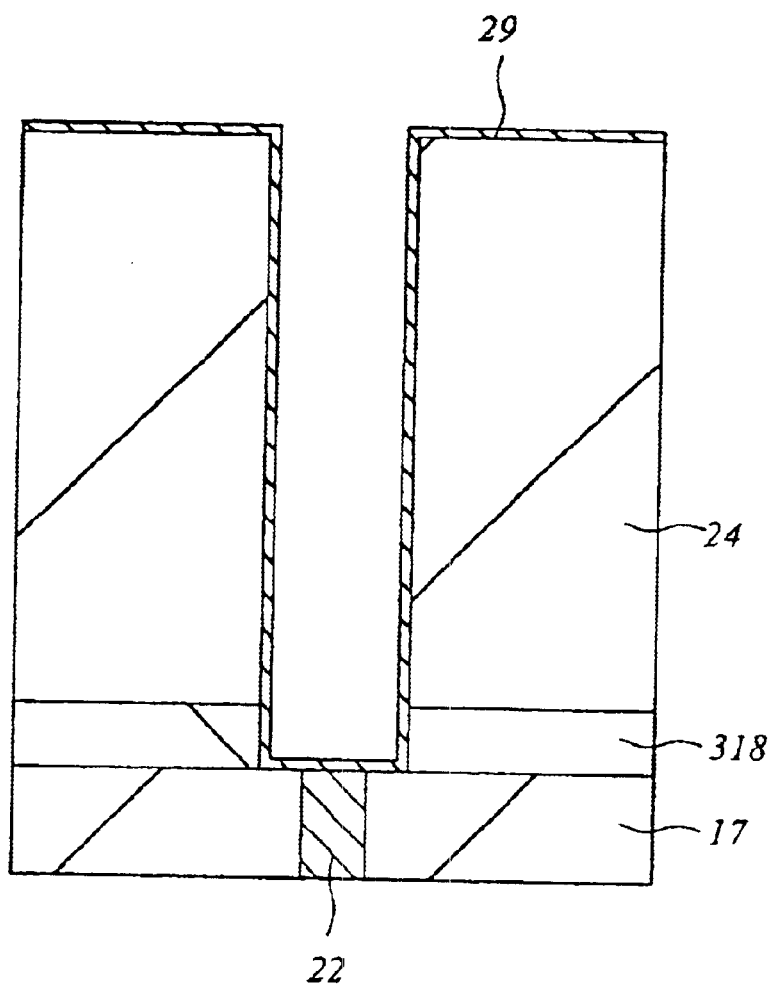
FIG. 40 is a cross-sectional view of a principal portion of a semiconductor substrate for illustrating a process for manufacturing a semiconductor integrated circuit device that is the fourth embodiment of the present invention.

Subsequently, as shown in FIG. 38, a photoresist film (not shown) is formed on the hard mask 26, and the hard mask 26 is dry-etched by using this photoresist film as a mask. Then, by using the hard mask 26 as a mask and by dry-etching the silicon oxide film 24 and silicon nitride film 18, a deep aperture (recess) 27 is formed therein. A surface of each plug 22 in each through hole 19 is exposed at the bottom surface of the aperture (recess) 27. Next, the hard mask 26 remaining in an upper portion of the silicon oxide film 24 is removed by using a solution containing hydrogen peroxide solution. Thereafter, as shown in FIG. 39, a tantalum oxide film 28 (having a film thickness of about 5 nm) is deposited on the silicon oxide film 24 and in the aperture 27 by a CVD method. This tantalum oxide film 28 can be formed within a temperature range of 400° C. to 450° C. by using $Ta(OC_2H_5)_5$ and $O_2$ as material gas. Then, heat treatment is performed at 700° C. for 3 minutes in $NH_3$ atmosphere, and the tantalum oxide film is converted to the tantalum nitride film (see FIG. 40). The tantalum nitride film 29 has an adhesive characteristic of the underlying silicon oxide film 24 and the Ru film 30 described later, so that the tantalum nitride film 29 is used as an adhesive layer. Also, since tantalum nitride is conductor and a fine film, the tantalum nitride film 29 plays such a role of a barrier layer as to prevent undesirable reaction from taking place on a contact interface between a Ru film 30a described later and each plug 22.

Thus, according to the present embodiment, it is possible to form, on a single layer, an adhesive layer and the tantalum nitride film 29 playing a role of a barrier layer and thereby to omit a step of forming the barrier layer. Additionally, since heat treatment is performed in $NH_3$ atmosphere, the silicon oxide can be reduced which is formed at the contact interface between the tantalum oxide film 28 and each plug 22. As a result, it is possible to avoid electrical contact failure affected by the silicon oxide provided on each plug 22.

Figure 41:
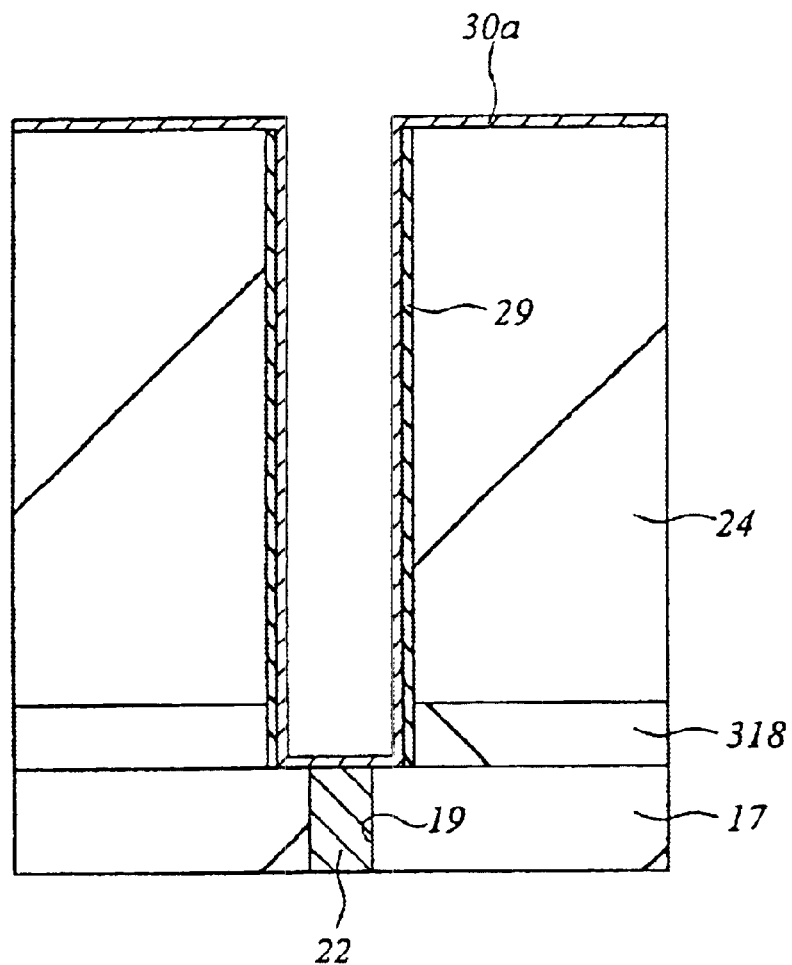
FIG. 41 is a cross-sectional view of a principal portion of a semiconductor substrate for illustrating a process for manufacturing a semiconductor integrated circuit device that is the fourth embodiment of the present invention.

Subsequently, as shown in FIG. 41, a Ru film 30a (having a film thickness of about 10 nm) is deposited on the tantalum nitride film 29 by a CVD method. If a thin Ru film may be formed by a sputtering method before the Ru film 30a is deposited by this CVD method, then the film formed by the sputtering method serves as a seed and the Ru film 30a can be formed efficiently by a CVD method. This Ru film 30a is formed by evaporating a solution of a Ru organic compound such as a tetrahydrofuran solution or the like containing ethylcyclopenta-dienyl ruthenium $(Ru(C_2H_5C_5H_4)_2)$ and by being made to react with $O_2$. Then, heat treatment is performed at 600° C. for 3 minutes in reducing atmosphere such as $NH_3$ atmosphere, and thereafter heat treatment is performed at 750° C. for 2 minutes in non-oxidizing atmosphere.

Figure 42:
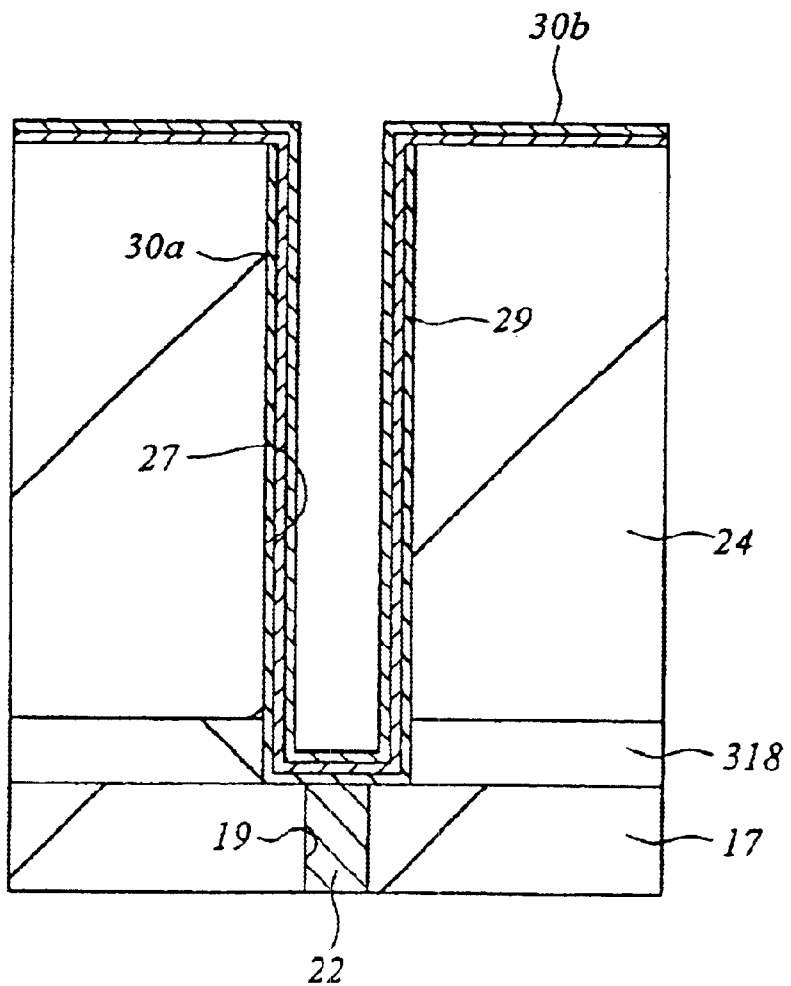
FIG. 42 is a cross-sectional view of a principal portion of a semiconductor substrate for illustrating a process for manufacturing a semiconductor integrated circuit device that is the fourth embodiment of the present invention.

Next, as shown in FIG. 42, a Ru film 30b (having a film thickness of about 20 nm) is further deposited on the Ru film 30a under the same condition as the case where the Ru film 30a is formed. In this case, since the Ru film 30b contains a little amount of impurities and is formed on the Ru film 30a made fineness, it is possible to omit heat treatment (for example, at 750° C. for 2 minutes in non-oxidizing atmosphere) for making the Ru film 30b fineness. However, performance of the heat treatment for making the film fineness can further improve a characteristic thereof.

Thus, in the present embodiment, the Ru film has a laminating structure of the Ru films 30a and 30b, and, after the Ru film 30a is formed and heat treatment is performed, the Ru film 30b is formed. Therefore, it is possible to remove effectively impurities included in the Ru film 30a. As a result, fineness of the Ru films 30a and 30b can be achieved.

Figure 43:
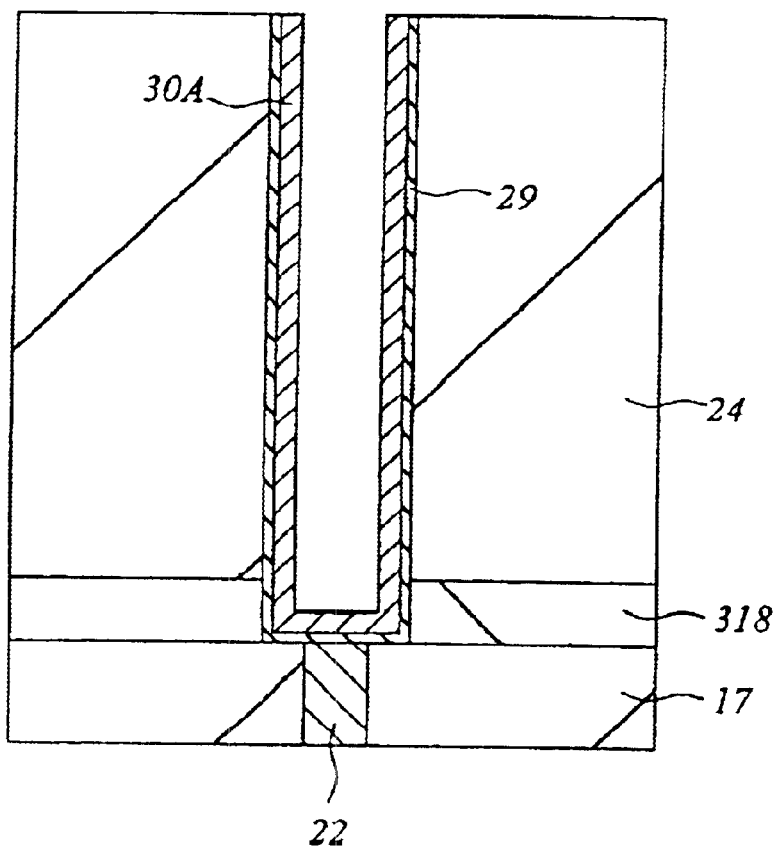
FIG. 43 is a cross-sectional view of a principal portion of a semiconductor substrate for illustrating a process for manufacturing a semiconductor integrated circuit device that is the fourth embodiment of the present invention.

Subsequently, the Ru film 30b is coated with a photoresist film (not shown). All surfaces of the photoresist film are exposed. Thereafter, the photoresist film (not shown) is made to remain in the aperture 27 by development thereof. This photoresist film is used as a protective film for preventing the Ru films 30a and 30b located in the aperture 27 (i.e., on a side wall and a bottom surface) from being removed when the disused Ru films 30a and 30b located on the silicon oxide film 24 is removed by dry etch. Then, as shown in FIG. 43, by performing dry etch using the photoresist film as a mask and by removing the Ru films 30a and 30b located on the silicon oxide film 24, the lower electrode 30A is formed. And, the photoresist film located in the aperture 27 is removed.

Figure 44:
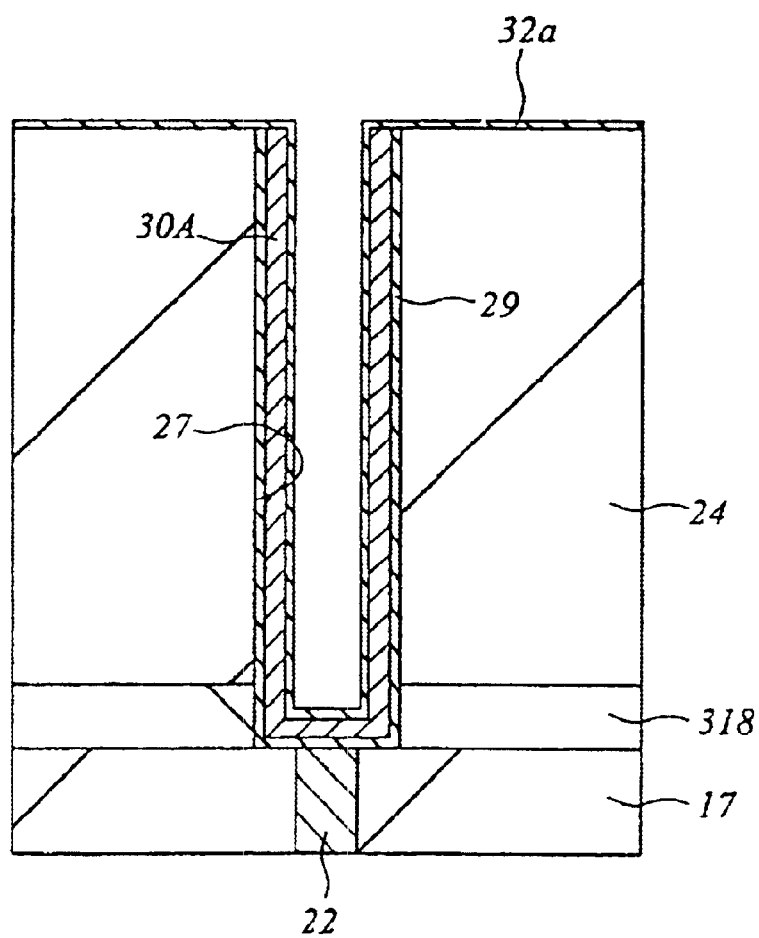
FIG. 44 is a cross-sectional view of a principal portion of a semiconductor substrate for illustrating a process for manufacturing a semiconductor integrated circuit device that is the fourth embodiment of the present invention.

Next, as FIG. 44 shows, a tantalum oxide film 32a constituting a capacitive insulating film is deposited on the silicon oxide film 24 and in the aperture 27 in which the lower electrode 30A is formed. The tantalum oxide film 32a is deposited by a CVD method using pentaethoxy tantalum ($Ta(OC_2H_5)_5$) and oxygen as materials, and a temperature for forming the film is 420° C. Also, the tantalum oxide film 32 has a film thickness of about 5 nm. Thereafter, heat treatment is performed at 700° C. for 2 minutes in non-oxidizing atmosphere, and the tantalum oxide film 32 is crystallized.

Figure 45:
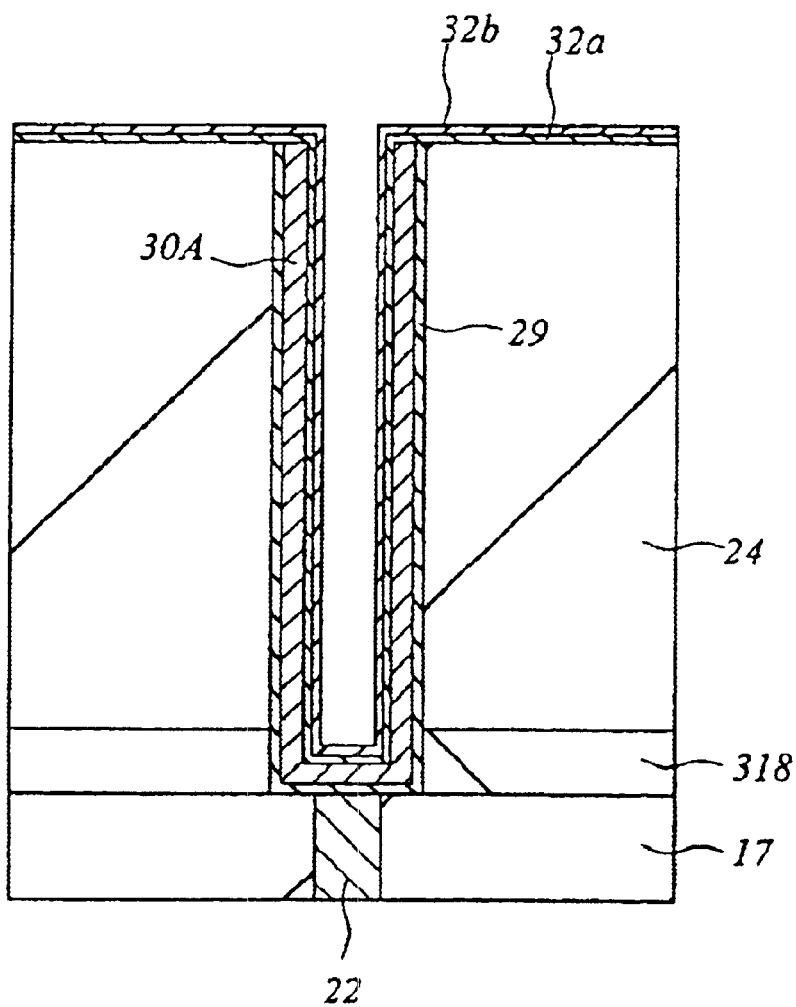
FIG. 45 is a cross-sectional view of a principal portion of a semiconductor substrate for illustrating a process for manufacturing a semiconductor integrated circuit device that is the fourth embodiment of the present invention.

Next, as shown in FIG. 45, a tantalum oxide film 32b is further deposited on the tantalum oxide film 32a. This tantalum oxide film 32b is also deposited in the same condition as the tantalum oxide film 32a, and has a film thickness of about 10 nm. In this case, since the tantalum oxide film 32a being a base thereof has already been crystallized, the tantalum oxide film 32b is crystallized at the time of formation of the film by a CVD method. Therefore, it is possible to omit heat treatment for crystallization thereof.

Figure 46:
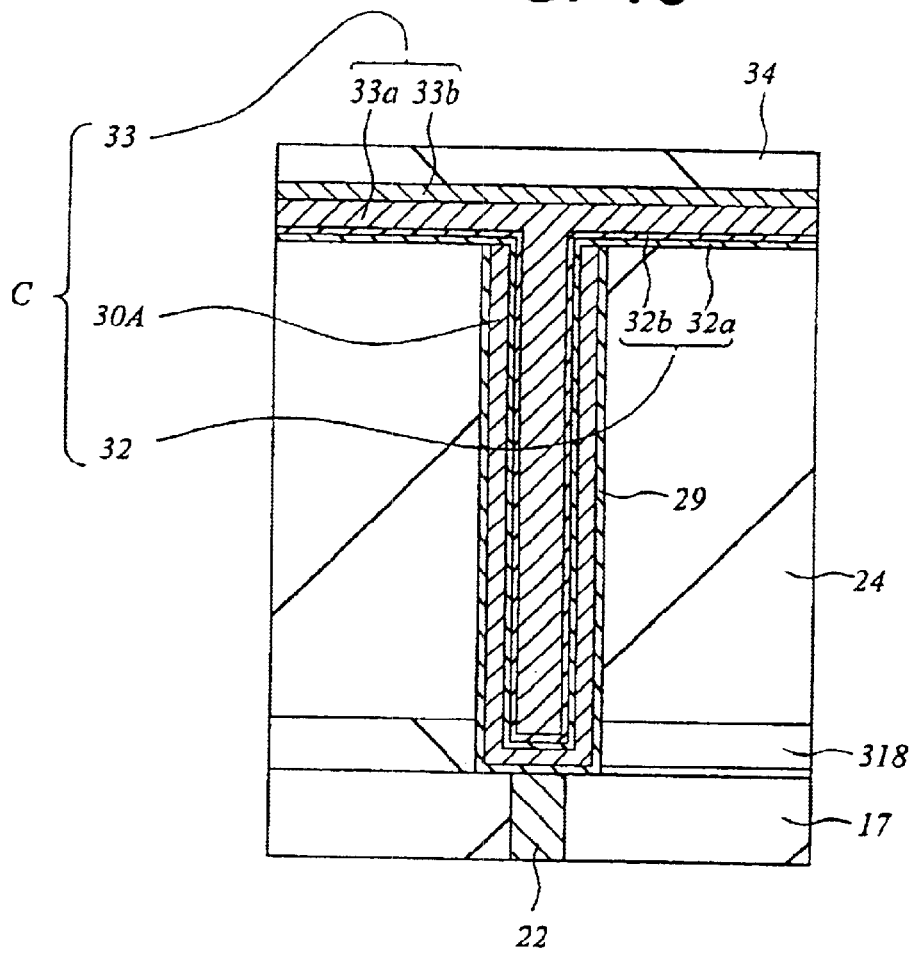
FIG. 46 is a cross-sectional view of a principal portion of a semiconductor substrate for illustrating a process for manufacturing a semiconductor integrated circuit device that is the fourth embodiment of the present invention.

Next, as shown in FIG. 46, the upper electrode 33 is formed on the tantalum oxide film 32. The upper electrode 33 is formed, for example, by depositing a Ru film 33a (having a film thickness of about 70 nm) and a W film 33b (having a film thickness of about 100 nm) on the tantalum oxide film 32 by a CVD method. The W film 33b is provided for the purpose of reducing contact resistance between the upper electrode 33 and an upper-layer wiring. A TiN film may be formed between the Ru film 33a and the W film 33b to prevent resistance increase caused by diffusion of gas (oxygen or hydrogen) into the W film 33b from the capacitive insulating film (tantalum oxide film 32).

Thus, from processes described above, the information storing capacitive element C is nearly completed, which comprises the lower electrode 30A formed of the Ru films 30a and 30b, and the capacitive insulating film 32 formed of the tantalum oxide films 32a and 32b, and the upper electrode 33 formed of the W film 33b/the Ru film 33a. And, a memory cell of a DRAM is nearly completed, which is constituted by the memory cell selecting MISFET Qs and the information storing capacitive element C connected in series thereto.

Thereafter, an inter-layer insulating film 34 formed of silicon oxide or the like is formed on the information storing capacitive element C, and two layers of Al wiring are formed on this inter-layer insulating film 34, and a passivation film is formed on an uppermost layer of Al wiring. However, a drawing for illustrating this structure will be omitted.

As described above, according to the present embodiment, it is possible to form, on the single layer, both the adhesive layer and the tantalum nitride film 29 playing a role of the barrier layer, and to omit the step of forming the barrier layer. Moreover, the Ru film constituting the lower electrode 30A has a laminating structure of the Ru films 30a and 30b and heat treatment is performed after the Ru film 30a is formed, so that it is possible to remove effectively impurities included in the Ru film 30a. As a result, fineness of the respective Ru films 30a and 30b can be achieved.

Hence, similarly to the case of the first embodiment, it is possible to prevent the tantalum nitride film 29 being in contact with the Ru film 30a from being oxidized by affection of oxygen included in the Ru film, and to ensure electrical contact between each of the Ru films 30a and 30b and the tantalum nitride film 29 (plug 22).

Further, since the Ru films 30a and 30b are made fine, it is possible to prevent shrinkage and change in the Ru film during heat treatment for forming the tantalum oxide films 32a and 32b formed thereon, and to reduce deformation in the tantalum oxide film. As a result, reduction of leakage current can be achieved.

As described above, the present inventions made by inventors is concretely described in accordance with the embodiments. However, the present invention is not limited to the above-mentioned embodiments, and it goes without saying that various changes and modifications can be made without departing from the gist thereof.

Of the inventions disclosed by the present application, effects obtained by representative ones will be briefly described as follows.

According to the present invention, oxygen and organic impurities taken in the Ru film can be removed from the Ru film. And, fineness of the Ru film can be achieved.

Therefore, it is possible to prevent the Ru film being in contact with the barrier layer from being oxidized by affection of oxygen included in the Ru film, and to ensure electrical contact between the Ru film and the barrier layer (plug).

Further, since the Ru film is made fineness, it is possible to prevent shrinkage and change of the Ru film caused by heat treatment performed during formation of the capacitive insulating film constituted by the tantalum oxide film or the like to be formed thereon, and to reduce deformation in the tantalum oxide film, and to reduce leakage current.

As a result, the Ru film constituting the lower electrode of the information storing capacitive element can be formed with high precision. And, by forming the Ru film with high precision, it is possible to improve not only characteristics of the capacitive insulating film provided thereon, but also characteristics of the information storing capacitive element. Moreover, it is possible to increase a yield of a semiconductor integrated circuit device of a DRAM or the like.

What is claimed is:

1. A process for manufacturing a semiconductor integrated circuit device, comprising the steps of:

(a) forming a memory cell selecting MISFET over a major surface of a semiconductor substrate;

(b) forming a plug electrically connected to a source and drain region of said memory cell selecting MISFET;

(c) forming a silicon oxide film on said plug;

(d) forming an aperture, in said silicon oxide film, arriving at a surface of said plug;

(e) depositing a Ru film on a side wall and a bottom portion of said aperture and performing a heat treatment in a reducing atmosphere;

(f) forming a capacitive insulating film over said Ru film; and (g) forming an upper electrode on said capacitive insulating film.

2. The process according to claim 1,
wherein said step (e) comprises the step of repeating deposition of the Ru film and performance of said heat treatment to form a laminated film of the Ru film on the side wall and the bottom portion of said aperture.

3. A process for manufacturing a semiconductor integrated circuit device, comprising the steps of:
(a) forming a memory cell selecting MISFET over a major surface of a semiconductor substrate;
(b) forming a plug electrically connected to a source and drain region of said memory cell selecting MISFET;
(c) forming a silicon oxide film on said plug;
(d) forming an aperture, in said silicon oxide film, arriving at a surface of said plug;
(e) making an organic compound of Ru react with an oxidizer and thereby forming a Ru film on a side wall and a bottom portion of said aperture;
(f) heat-treating said Ru film in reducing atmosphere;
(g) forming a capacitive insulating film over said Ru film; and
(h) forming an upper electrode over said capacitive insulating film.

4. A process for manufacturing a semiconductor integrated circuit device, comprising the steps of:
(a) forming a memory cell selecting MISFET over a major surface of a semiconductor substrate;
(b) forming a plug electrically connected to a source and drain region of said memory cell selecting MISFET;
(c) forming a silicon oxide film on said plug;
(d) forming an aperture, in said silicon oxide film, arriving at a surface of said plug;
(e) making an organic compound of Ru react with an oxidizer and thereby forming a Ru film on a side wall and a bottom portion of said aperture;
(f) performing first heat treatment in reducing atmosphere and second heat treatment in non-oxidizing atmosphere at said Ru film;
(g) forming a capacitive insulating film over said Ru film; and
(h) forming an upper electrode over said capacitive insulating film.

5. A process for manufacturing a semiconductor integrated circuit device, comprising the steps of:
(a) forming an inter-layer insulating film over a semiconductor substrate;
(b) forming an aperture in said inter-layer insulating film;
(c) forming a first conductive film on a side wall and a bottom portion of said aperture and performing a heat treatment in a reducing atmosphere;
(d) forming an insulating film over said first conductive film; and
(e) forming a second conductive film over said insulating film.

6. The process according to claim 5, further including, between said steps (b) and (c), a step of:

(f) forming a third conductive film on the side wall and the bottom portion of said aperture by a sputtering method.

7. The process according to claim 6,
wherein said first and third conductive films are made of Ru.

8. The process according to claim 5,
wherein said step (c) comprises the step of repeating deposition of said first conductive film and performance of said heat treatment to form a laminated film of said first conductive film on the side wall and the bottom portion of said aperture.

9. The process according to claim 5,
wherein the performance of heat treatment in said step (c) includes treatment performed in non-oxidizing atmosphere.

10. A process for manufacturing a semiconductor integrated circuit device, comprising the steps of:
(a) forming a memory cell selecting MISFET over a major surface of a semiconductor substrate;
(b) forming a plug electrically connected to a source and drain region of said memory cell selecting MISFET;
(c) forming a silicon oxide film on said plug;
(d) forming an aperture, in said silicon oxide film, arriving at a surface of said plug;
(e) depositing a Ru film on a side wall and a bottom portion of said aperture;
(f) removing impurities of the Ru film by heat treating the Ru film in a reducing atmosphere;
(g) forming a capacitive insulating film over said Ru film; and
(h) forming an upper electrode on said capacitive insulating film.

11. The process according to claim 10,
wherein said steps (e) and (f) are repeated prior to step (g) to form a laminated film comprised of a plurality of layers of said Ru film.

12. A process according to claim 10 wherein said step (f) comprises heat treating said Ru film in a reducing atmosphere followed by heat treating said Ru film in a non-oxidizing atmosphere.

13. A process according to claim 12 comprising heat treating said Ru film at about 600° C. for about 3 minutes in a reducing atmosphere and then heat treating said Ru film at about 750° C. for about 2 minutes in a non-oxidizing atmosphere.

14. A process according to claim 12, wherein said reducing atmosphere includes $NH_3$.

15. A process according to claim 14, wherein said non-oxidizing atmosphere includes $N_2$.

16. A process according to claim 13, wherein said reducing atmosphere includes $NH_3$.

17. A process according to claim 16, wherein said non-oxidizing atmosphere includes $N_2$.

* * * * *